(12) United States Patent
 Morimitsu

(10) Patent No.: US 8,144,039 B2
(45) Date of Patent: Mar. 27, 2012

(54) SEMICONDUCTOR INTEGRATED DEVICE

(75) Inventor: Hiroyuki Morimitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/832,367

(22) Filed: Jul. 8, 2010

(65) Prior Publication Data
US 2011/0012761 A1    Jan. 20, 2011

(30) Foreign Application Priority Data

Jul. 14, 2009   (JP) ................................. 2009-166078

(51) Int. Cl.
*H03M 9/00* (2006.01)
(52) U.S. Cl. ........................................ 341/100; 370/412
(58) Field of Classification Search .................. 341/100, 341/101; 370/412, 423, 426
See application file for complete search history.

(56) References Cited

U.S. PATENT DOCUMENTS

| | | | | |
|---|---|---|---|---|
| 7,143,205 B2 * | 11/2006 | Sakugawa | ........................ | 710/22 |
| 7,562,271 B2 * | 7/2009 | Shaeffer et al. | ................ | 714/724 |
| 7,660,924 B2 * | 2/2010 | Katayama et al. | ............ | 710/106 |
| 7,751,418 B2 * | 7/2010 | Russell et al. | ................ | 370/423 |

FOREIGN PATENT DOCUMENTS

| | | |
|---|---|---|
| JP | 02029991 | 1/1990 |
| JP | 2004062725 | 2/2004 |

* cited by examiner

*Primary Examiner* — Brian Young
(74) *Attorney, Agent, or Firm* — Turocy & Watson, LLP

(57) ABSTRACT

In one embodiment, a semiconductor integrated device includes a plurality of semiconductor chips each having a first internal circuit and a second internal circuit and being stacked while displaced from each other. The first internal circuit processes a data signal in accordance with a predetermined process. The second internal circuit receives a request signal from a transmission source and determines whether the request signal is a request to itself or not. When the request signal is the request to the second internal circuit itself, the second internal circuit receives a data signal from a transmission source and outputs the data signal to the first internal circuit. When the request signal is not the request to the second internal circuit itself, the second internal circuit transfers the request signal to a transfer destination, receives the data signal from the transmission source and transfers the data signal to the transfer destination.

20 Claims, 18 Drawing Sheets

SEMICONDUCTOR INTEGRATED DEVICE

CROSS REFERENCE TO RELATED APPLICATION

This application is based upon and claims the benefit of priority from the prior Japanese Patent Application No. 2009-166078, filed on Jul. 14, 2009, the entire contents of which are incorporated herein by reference.

FIELD

Embodiments described herein relate generally to a semiconductor integrated device.

BACKGROUND

In a semiconductor integrated device including multiple stacked semiconductor chips, namely, in a so-called MCP (Multi Chip Package), one pad or signal wiring is shared by the multiple semiconductor chips. Accordingly, a large load is placed on the signal wiring, and the transmission speed of the signal decreases. Therefore, there is a problem in that a sufficient transmission speed cannot be obtained.

In contrast, there is a semiconductor device in which the semiconductor element is divided into multiple blocks, and a clock signal is supplied to only an intended block. Such kind of semiconductor device is disclosed in Japanese Patent Application Publication No. 2-2991.

The above semiconductor device is a clock synchronization-type semiconductor integrated device including multiple storage elements which are brought into synchronization by using at least one clock signal or inverted clock signal generated by a clock signal generation unit and supplied via multiple clock drivers. The storage elements are divided into minor blocks in such a manner that storage elements located in proximity to each other in terms of the physical layout are grouped into the same minor block or in such a manner that storage elements having a high degree of logical coupling with each other are grouped into the same minor block. A buffer circuit is arranged in each of the minor blocks. In the previous stage of the buffer circuit, a transmission gate is arranged to control whether the clock signal is supplied or not.

Accordingly, the clock signal is supplied only to the intended block, and the other blocks are electrically separated. Therefore, the redundant load placed on the clock signal line can be reduced, and the delay of the clock signal can be reduced.

However, in the semiconductor device, each block is connected to the clock signal line in parallel. Accordingly, as the number of intended blocks increases, the delay of the clock signal increases. As a result, there is a problem in that a sufficient transmission speed cannot be obtained.

DETAILED DESCRIPTION

Figure 1:
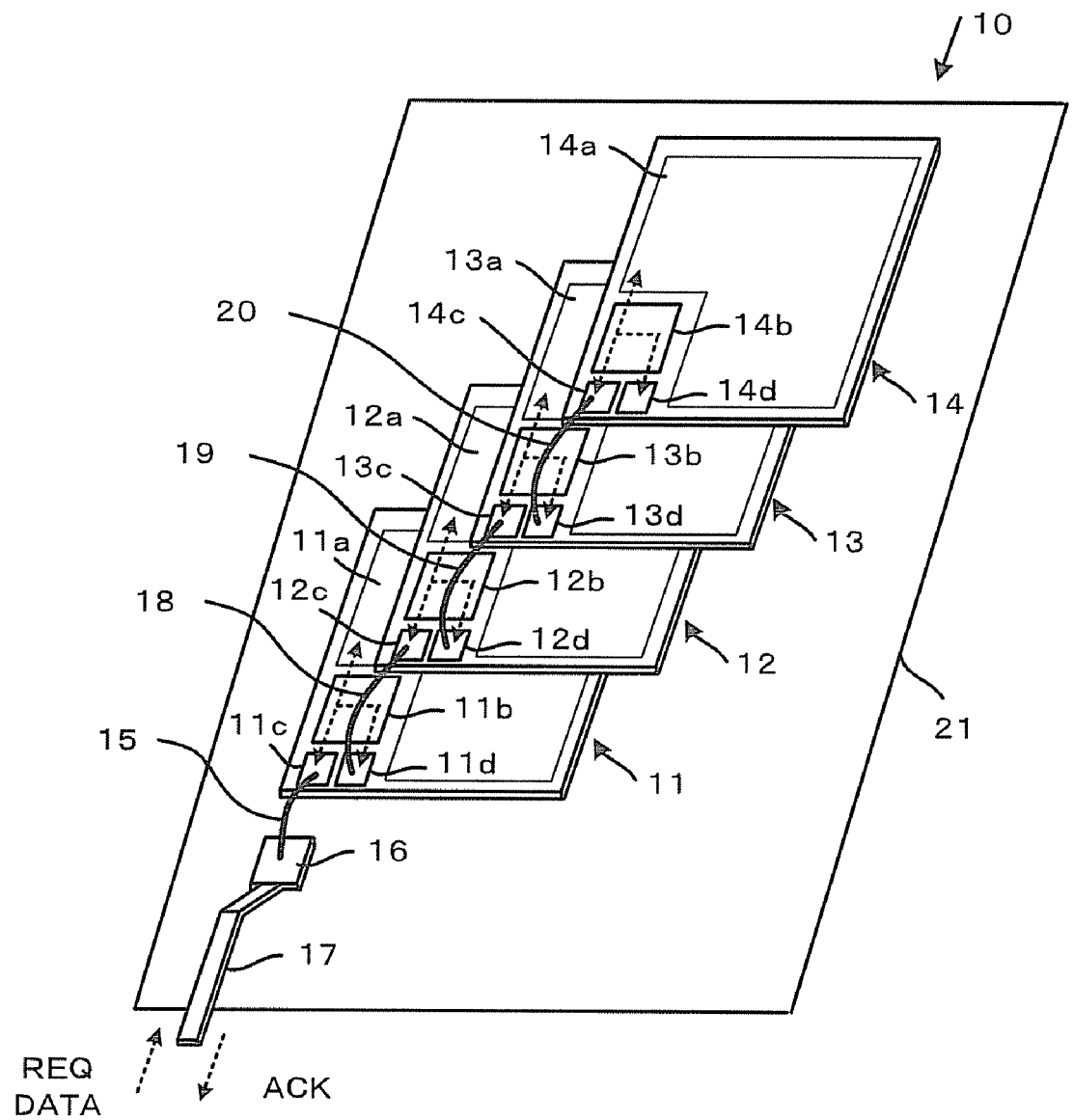
FIG. 1 is a perspective view showing a semiconductor integrated device according to a first embodiment.

In one embodiment, a semiconductor integrated device includes multiple semiconductor chips each having a first internal circuit and a second internal circuit and being stacked while displaced from each other. The first internal circuit processes a data signal in accordance with a predetermined process. The second internal circuit receives a request signal from a transmission source and determines whether the request signal is a request to itself or not. When the request signal is the request to the second internal circuit itself, the second internal circuit receives a data signal from a transmission source and outputs the data signal to the first internal circuit. When the request signal is not the request to the second internal circuit itself, the second internal circuit transfers the request signal to a transfer destination, receives the data signal from the transmission source and transfers the data signal to the transfer destination. The transmission source with respect to a first semiconductor chip of the multiple semiconductor chips is a second semiconductor chip of the multiple semiconductor chips stacked on one side from the first semiconductor chip. The transfer destination with respect to the first semiconductor chip is a third semiconductor chip of the multiple semiconductor chips stacked on the other side from the first semiconductor chip.

Hereinafter, further embodiments will be described with reference to the drawings. In the drawings, same reference characters denote the same or similar portions.

[First Embodiment]

Figure 2:
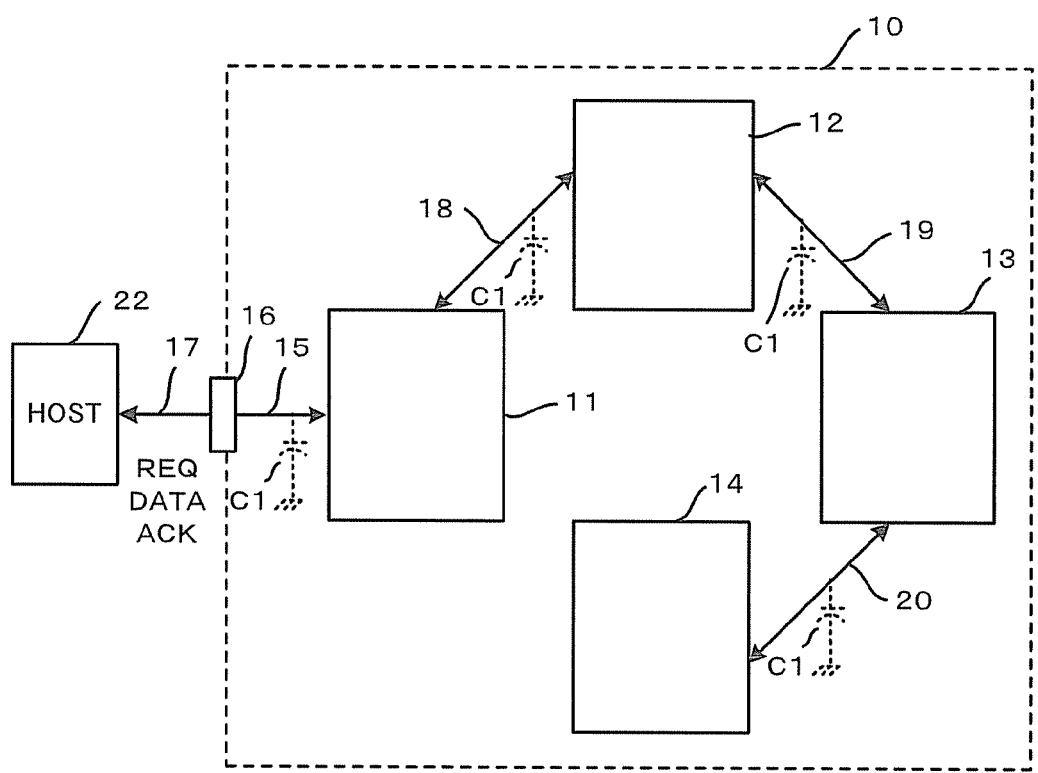
FIG. 2 is a view showing a signal transmission path of the semiconductor integrated device according to the first embodiment.
Figure 3:
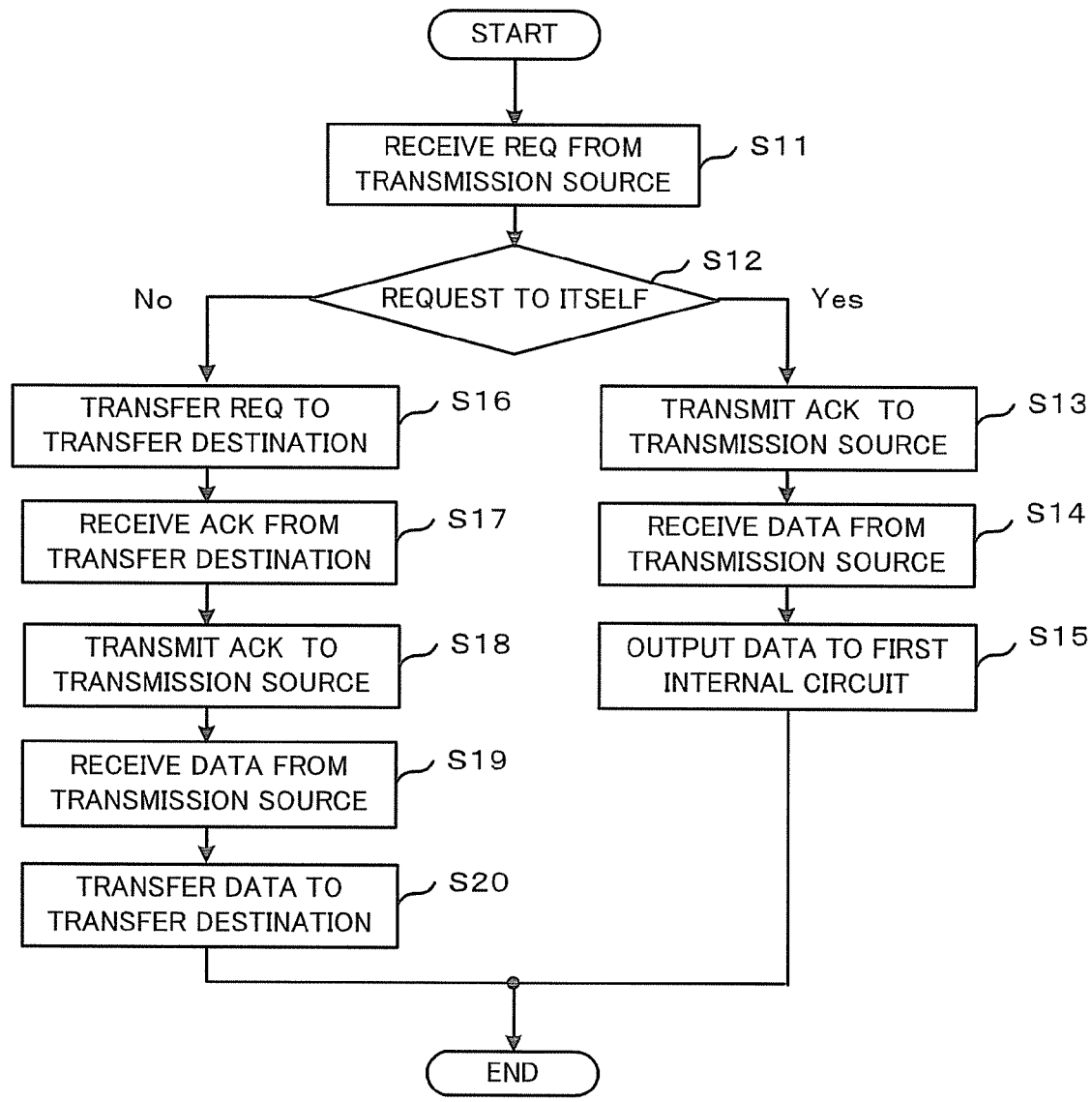
FIG. 3 is a flowchart showing a function of the main portion of the semiconductor integrated device according to the first embodiment.
Figure 4:
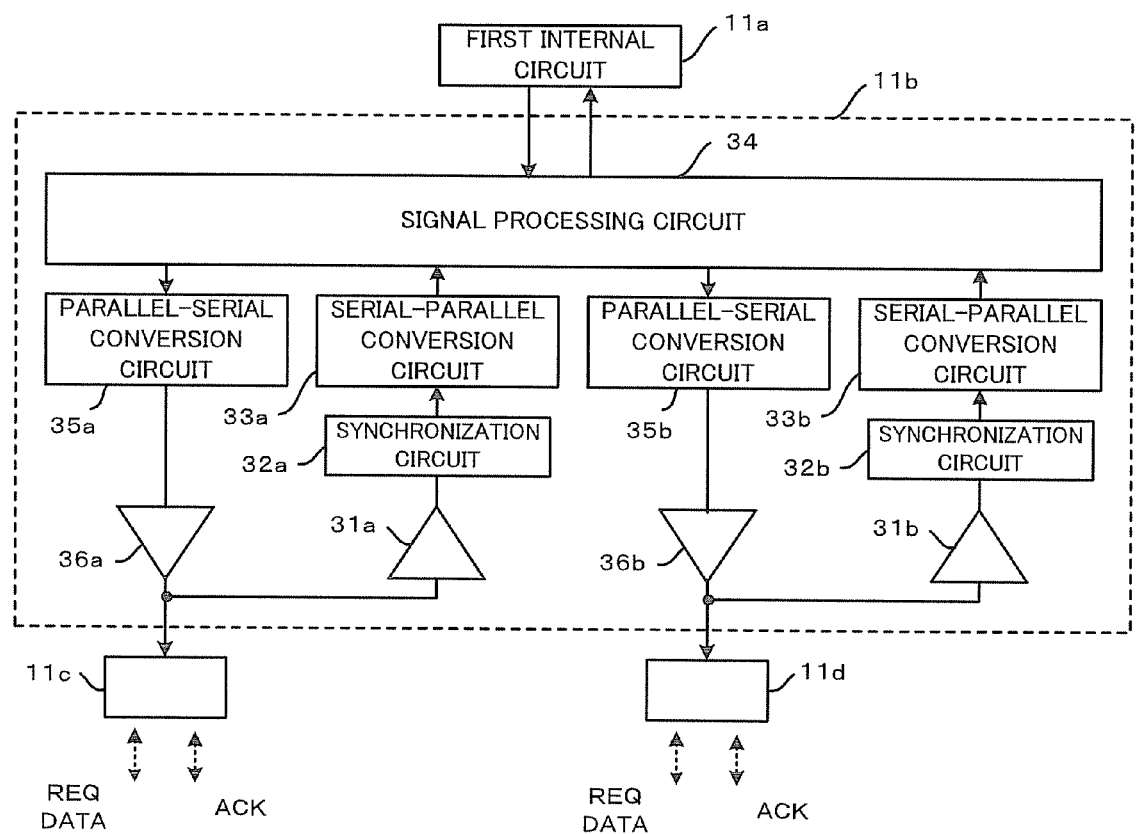
FIG. 4 is a block diagram showing a circuit of the main portion of the semiconductor integrated device according to the first embodiment.
Figure 5:
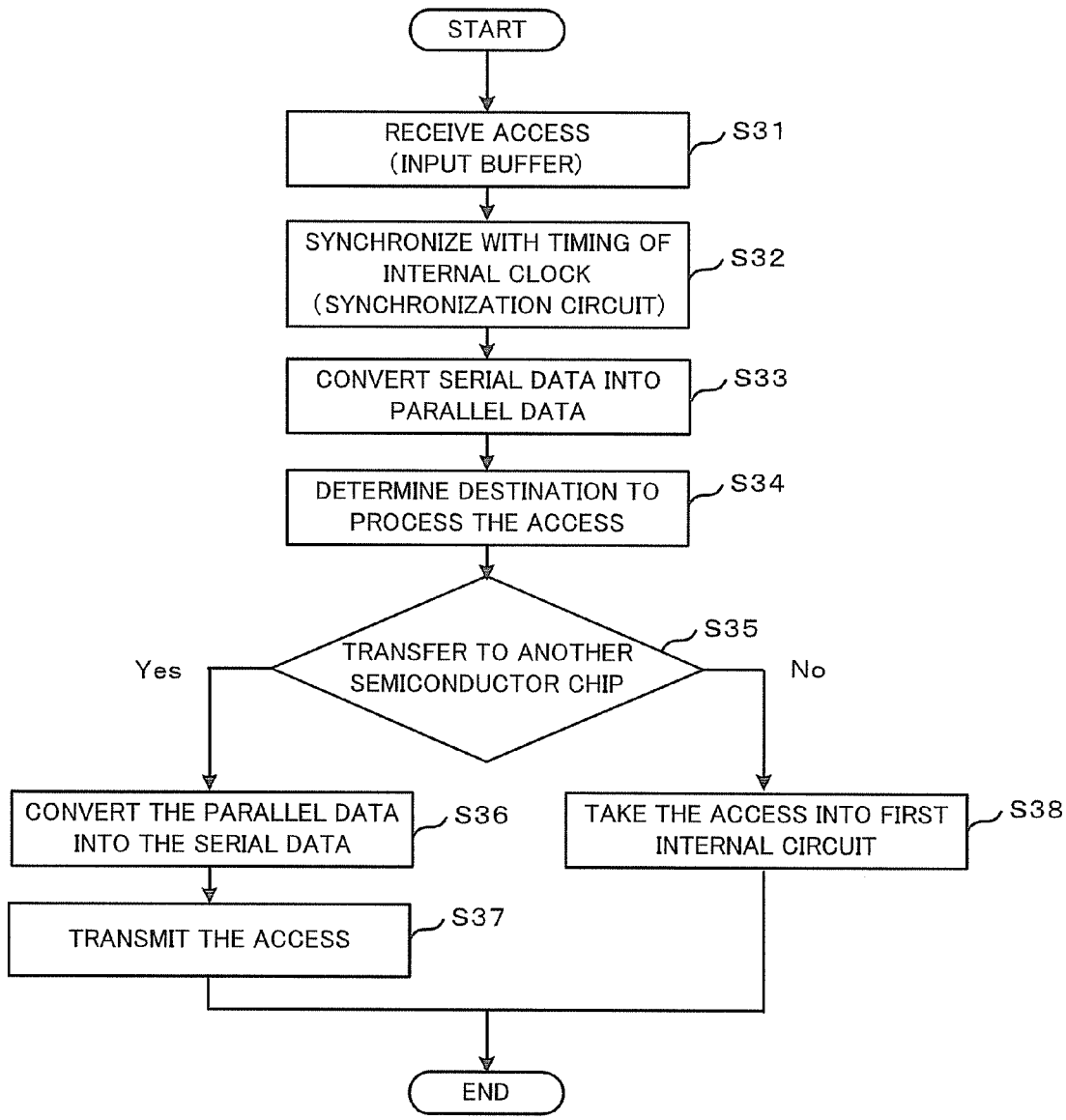
FIG. 5 is a flowchart showing a circuit operation of the main portion of the semiconductor integrated device according to the first embodiment.
Figure 6:
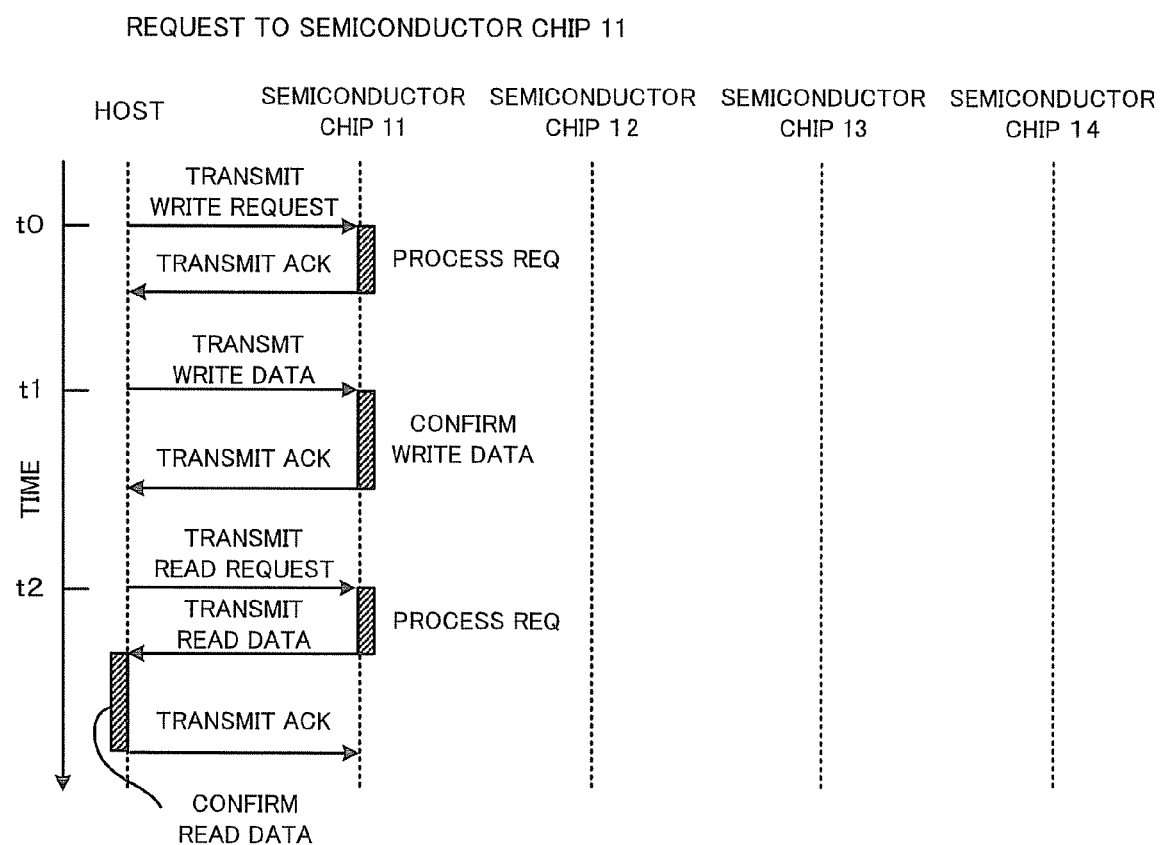
FIG. 6 is a timing chart showing an operation of the semiconductor integrated device according to the first embodiment.
Figure 7:
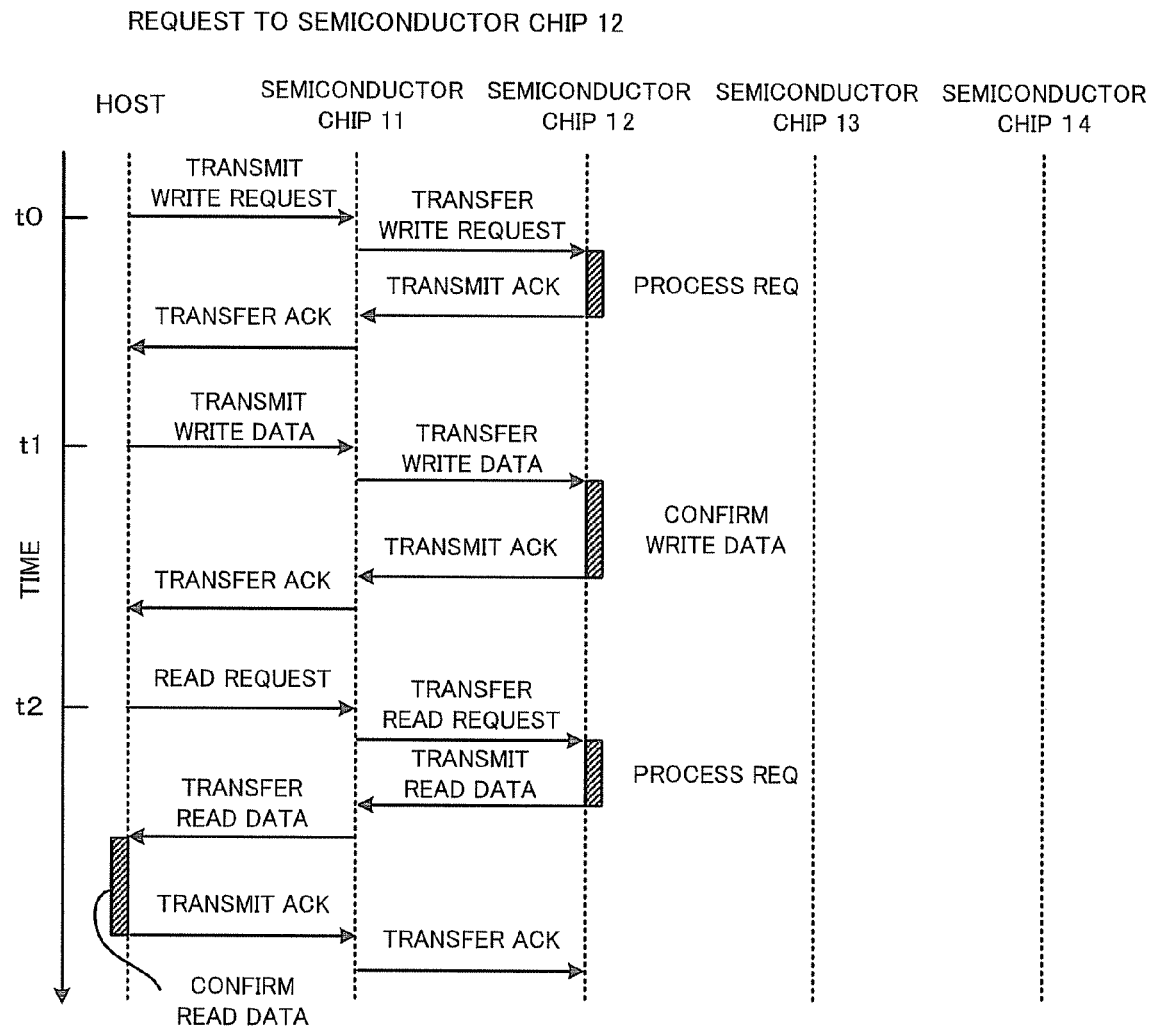
FIG. 7 is a timing chart showing an operation of the semiconductor integrated device according to the first embodiment.
Figure 8:
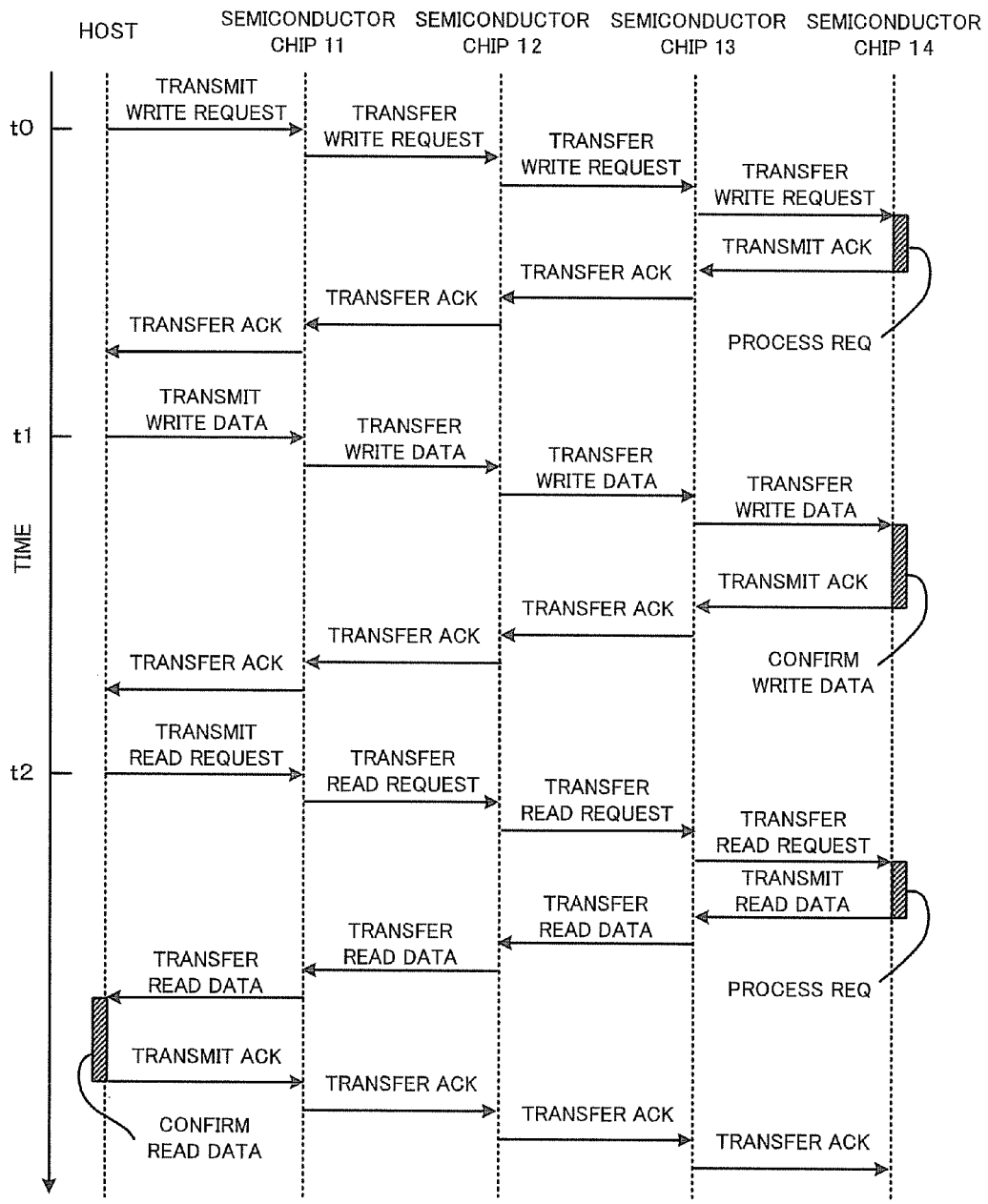
FIG. 8 is a timing chart showing an operation of the semiconductor integrated device according to the first embodiment.

A first embodiment of a semiconductor integrated device will be described with reference to FIGS. 1 to 8. FIG. 1 is a perspective view showing a semiconductor integrated device. FIG. 2 is a view showing a signal transmission path of the semiconductor integrated device. FIG. 3 is a flowchart showing a function of the main portion of the semiconductor integrated device. FIG. 4 is a block diagram showing a circuit of the main portion of the semiconductor integrated device. FIG. 5 is a flowchart showing a circuit operation of the main portion of the semiconductor integrated device. FIGS. 6 to 8 are timing charts showing an operation of the semiconductor integrated device.

The embodiment is an example of a case that the semiconductor integrated device is an MCP (Multi Chip Package) type nonvolatile semiconductor memory in which NAND type nonvolatile memory chips having a floating gate are stacked.

As shown in FIG. 1, a semiconductor integrated device 10 of the first embodiment is an MCP (Multi Chip Package) semiconductor integrated device including multiple semiconductor chips 11, 12, 13, 14 which are stacked while displaced from each other.

The semiconductor integrated device 10 receives a request signal REQ and a data signal DATA to determine a semiconductor chip write-accessed by an external circuit (not shown) such as a memory controller, and transmits an acknowledge signal ACK, indicating that the request has been processed, to the external circuit.

The semiconductor chips 11, 12, 13, 14 are NAND nonvolatile memory chips having floating gates. First internal circuits 11a, 12a, 13a, 14a of the semiconductor chips 11, 12, 13, 14 are memory cell array.

Second internal circuits 11b, 12b, 13b, 14b are circuits to control write-access and read-access to/from the memory cell array. The second internal circuits 11b, 12b, 13b, 14b include first signal terminals 11c, 12c, 13c, 14c and second signal terminals 11d, 12d, 13d, 14d, which are pairs of signal terminals to bi-directionally exchange the request signal REQ, the data signal DATA, and the acknowledge signal ACK with the external circuit and an adjacent semiconductor chip.

The first signal terminal 11c of the bottom semiconductor chip 11 is electrically connected to a pad 16 via a signal wiring 15. The pad 16 is connected to a lead terminal 17 to be drawn to the outside. The second signal terminals 11d, 12d, 13d of the semiconductor chips 11, 12, 13 are electrically connected to the first signal terminals 12c, 13c, 14c of the semiconductor chips 12, 13, 14 stacked on the semiconductor chips 11, 12, 13 via signal wirings 18, 19, 20, respectively.

The semiconductor integrated device 10 has an enclosure 21 in which the semiconductor chips 11, 12, 13, 14, the signal wirings 15, 18, 19, 20, and the pad 16 are integrally sealed with resin in such a manner that one end of the lead terminal 17 sticks out of the side surface.

FIG. 2 is a diagram illustrating a signal transmission path of the semiconductor integrated device 10. As shown in FIG. 2, the semiconductor chips 11, 12, 13, 14 are connected in series via the signal wirings 18, 19, 20. The request signal REQ, the data signal DATA, and the acknowledge signal ACK are bi-directionally exchanged only between the adjacent semiconductor chips.

As a result, the load placed on each of the signal wirings 15, 18, 19, is a capacity C1 which is a summation of capacities associated with the first signal terminal and the second signal terminal of the adjacent semiconductor chips regardless of the number of stacked semiconductor chips.

Accordingly, there is neither the problem of the decrease in the signal transmission speed caused by the load increasing in accordance with the number of stacked semiconductor chips, nor the problem of failing to obtain a sufficient transmission speed. Therefore, the semiconductor integrated device including the multiple stacked semiconductor chips and having a sufficient signal transmission speed can be obtained.

FIG. 3 is a flowchart illustrating the function of the second internal circuit 11b of the semiconductor chip 11. As shown in FIG. 3, when the second internal circuit 11b receives a request signal REQ from a transmission source (step S11), the second internal circuit 11b determines whether the request signal REQ is the request to itself or not (step S12).

When the request signal REQ is the request to the second internal circuit 11b itself (Yes in step S12), the second internal circuit 11b transmits an acknowledge signal ACK indicating the reception of the request signal REQ to the transmission source (step S13). After the transmission source receives the acknowledge signal ACK, the second internal circuit 11b receives a data signal DATA from the transmission source (step S14), and outputs the received data signal DATA to the first internal circuit 11a (step S15).

When the request signal REQ is not the request to the second internal circuit 11b itself (No in step S12), the second internal circuit 11b transfers the request signal REQ to a transfer destination (step S16). When the second internal circuit 11b receives a second acknowledge signal ACK indicating the reception of the request signal REQ from the transfer destination (step S17), the second internal circuit 11b transfers the acknowledge signal ACK to the transmission source (step S18). After the transmission source receives the acknowledge signal ACK, the second internal circuit 11b receives a data signal DATA from the transmission source (step S19), and transfers the received data signal DATA to the transfer destination (step S20).

The functions of the second internal circuits 12b, 13b, 14b of the semiconductor chips 12, 13, 14 are the same as those of the second internal circuit 11b, and the description thereof is omitted.

A transmission source means a semiconductor chip (second semiconductor chip) stacked on one side of any one of the semiconductor chips 11, 12, 13, 14 (first semiconductor chip). A transfer destination means a semiconductor chip (third semiconductor chip) stacked on the other side of any one of the semiconductor chips 11, 12, 13, 14 (first semiconductor chip).

More specifically, the transmission source of the bottom semiconductor chip 11 is the external circuit (not shown), and the transfer destination of the bottom semiconductor chip 11 is the semiconductor chip 12 stacked on the bottom semiconductor chip 11. The transmission source of the semiconductor chip 12 is the semiconductor chip 11 stacked below the semiconductor chip 12, and the transfer destination of the semiconductor chip 12 is the semiconductor chip 13 stacked on the semiconductor chip 12. The transmission source of the semiconductor chip 13 is the semiconductor chip 12 stacked below the semiconductor chip 13, and the transfer destination of the semiconductor chip 13 is the semiconductor chip 14 stacked on the semiconductor chip 13. The transmission source of the top semiconductor chip 14 is the semiconductor chip 13 stacked below the top semiconductor chip 14.

FIG. 4 is a block diagram illustrating the configuration of the second internal circuit 11b. As shown in FIG. 4, the second internal circuit 11b includes synchronization circuits 32a, 32b, serial-parallel conversion circuits 33a, 33b, a signal processing circuit 34, and parallel-serial conversion circuits 35a, 35b. The synchronization circuits 32a, 32b receive serial data signals indicating the request signal REQ, the data signal DATA, and the acknowledge signal ACK via buffers 31a, 31b, and output serial data signals synchronized with the timing of an internal clock signal. The serial-parallel conversion circuits 33a, 33b convert the serial data signals synchronized with the timing of the internal clock signal into parallel data signals. The signal processing circuit 34 processes the parallel data signals in accordance with a predetermined process. The parallel-serial conversion circuits 35a, 35b convert the parallel data signals into serial data signals, and output the serial data signals via buffers 36a, 36b. The second internal circuit 11b bi-directionally receives and transfers the serial data signals via the pair of signal terminals, i.e., via the first signal terminal 11c and the second signal terminal 11d.

The signal processing circuit 34 is a processing circuit having the function as explained below. When the serial data signal is a request signal REQ, the signal processing circuit 34 determines a requested semiconductor chip by decoding the parallel data signal. When the serial data signal is a data signal DATA, the signal processing circuit 34 outputs the parallel data signal to the first internal circuit 11a or the parallel-serial conversion circuits 35a, 35b in accordance with the determination result.

FIG. 5 is a flowchart illustrating operation of the second internal circuit 11b. As shown in FIG. 5, when the second internal circuit 11b receives access (step S31), the second internal circuit 11b is synchronized with the timing of the internal clock signal (step S32), converts a serial signal into a parallel signal (step S33), and determines a destination to process the access (step S34).

When the signal is to be transferred to another semiconductor chip (Yes in step S35), the second internal circuit 11b converts the parallel signal into the serial signal (step S36), and transmits the access (step S37). On the other hand, when the signal is to be processed by the semiconductor chip 11 itself (No in step S35), the second internal circuit 11b takes the access into the first internal circuit 11a (step S38).

The operation and the configuration of the second internal circuits 12b, 13b, 14b are the same as those of the second internal circuit 11b, and the description thereof is omitted.

Next, the operation of the semiconductor integrated device 10 will be explained more specifically. FIGS. 6 to 8 are timing charts illustrating the operation of the semiconductor integrated device 10. More specifically, a memory controller serving as a host issues a write request to any one of the semiconductor chips 11, 12, 13, 14, so as to write data to a memory cell, and the data is read in response to a read request.

FIG. 6 is a timing chart illustrating the operation in a case where a request is given to the bottom semiconductor chip 11. As shown in FIG. 6, when the host issues a write request to the semiconductor chip 11 at a time t0, the semiconductor chip 11 determines that the write request is given to the semiconductor chip 11 itself, and transmits an acknowledge signal ACK (first acknowledge signal), indicating that the request has been processed, to the host.

At a time t1, the host transmits write data to the semiconductor chip 11. The semiconductor chip 11 receives the write data, writes the data to the memory cell, and transmits an acknowledge signal ACK (second acknowledge signal), indicating the completion of the writing operation, to the host.

At a time t2, the host issues a read request to the semiconductor chip 11. The semiconductor chip 11 reads the data from the memory cell, and transmits the read data to the host. The host confirms the received read data, and transmits an acknowledge signal ACK, indicating that the data has been confirmed, to the semiconductor chip 11.

FIG. 7 is a timing chart illustrating the operation in a case where the request is given to the semiconductor chip 12. As shown in FIG. 7, when the host issues a write request to the semiconductor chip 11 at the time t0, the semiconductor chip 11 determines that the write request is not given to the semiconductor chip 11 itself, and transfers the write request to the semiconductor chip 12.

When the semiconductor chip 12 receives the write request, the semiconductor chip 12 determines that the write request is given to the semiconductor chip 12 itself, and transmits an acknowledge signal ACK, indicating that the request has been processed, to the semiconductor chip 11. When the semiconductor chip 11 receives the acknowledge signal, the semiconductor chip 11 transfers the acknowledge signal ACK to the host.

At the time t1, the host transmits the write data to the semiconductor chip 11, and the semiconductor chip 11 receives the write data. Then, the semiconductor chip 11 transfers the write data to the semiconductor chip 12. When the semiconductor chip 12 receives the write data, the semiconductor chip 12 writes the write data to the memory cell, and transmits an acknowledge signal ACK, indicating the completion of the writing operation, to the semiconductor chip 11. When the semiconductor chip 11 receives the acknowledge signal, the semiconductor chip 11 transfers the acknowledge signal ACK to the host.

When the host issues a read request to the semiconductor chip 11 at the time t2, the semiconductor chip 11 transfers the read request to the semiconductor chip 12. When the semiconductor chip 12 receives the read request, the semiconductor chip 12 reads data from the memory cell, and transmits the read data to the semiconductor chip 11. When the semiconductor chip 11 receives the read data, the semiconductor chip 11 transfers the read data to the host. The host confirms the received read data, and transmits an acknowledge signal ACK, indicating that the data has been confirmed, to the semiconductor chip 11. When the semiconductor chip 11 receives the acknowledge signal ACK, the semiconductor chip 11 transfers the acknowledge signal ACK to the semiconductor chip 12.

FIG. 8 is a timing chart illustrating the operation in a case where the request is given to the top semiconductor chip 14. As shown in FIG. 8, when the host issues a write request to the semiconductor chip 11 at the time t0, the semiconductor chip 11 determines that the write request is not given to the semiconductor chip 11 itself, and transfers the write request to the semiconductor chip 12. When the semiconductor chip 12 receives the write request, the semiconductor chip 12 determines that the write request is not given to the semiconductor chip 12 itself, and transfers the write request to the semiconductor chip 13. When the semiconductor chip 13 receives the write request, the semiconductor chip 13 determines that the write request is not given to the semiconductor chip 13 itself, and transfers the write request to the semiconductor chip 14.

When the semiconductor chip 14 receives the write request, the semiconductor chip 14 determines that the write request is given to the semiconductor chip 14 itself, and transmits an acknowledge signal ACK, indicating that the request has been processed, to the semiconductor chip 13. When the semiconductor chip 13 receives the acknowledge signal, the semiconductor chip 13 transfers the acknowledge signal ACK to the semiconductor chip 12. When the semiconductor chip 12 receives the acknowledge signal, the semiconductor chip 12 transfers the acknowledge signal ACK to the semiconductor chip 11. When the semiconductor chip 11 receives the acknowledge signal, the semiconductor chip 11 transfers the acknowledge signal ACK to the host.

At the time t1, the host transmits the write data to the semiconductor chip 11, the write data is transferred to the semiconductor chip 14 by the semiconductor chips 11, 12, 13 described above. When the semiconductor chip 14 receives the write data, the semiconductor chip 14 writes the write data to the memory cell, and transmits an acknowledge signal ACK, indicating the completion of the writing operation, to the semiconductor chip 13. The acknowledge signal ACK is transferred to the host by the semiconductor chips 13, 12, 11.

When the host issues a read request to the semiconductor chip 11 at the time t2, the read request is transferred to the semiconductor chip 14 by the semiconductor chips 11, 12, 13. When the semiconductor chip 14 receives the read request, the semiconductor chip 14 reads data from the memory cell, and transmits the read data to the semiconductor chip 13. The read data is transferred to the host by the semiconductor chips 13, 12, 11.

When the host receives the read data, the host confirms the read data to semiconductor chip 11, and transmits an acknowledge signal ACK, indicating that the data has been confirmed. The acknowledge signal ACK is transferred to the semiconductor chip 14 by the semiconductor chips 11, 12, 13.

Figure 9:
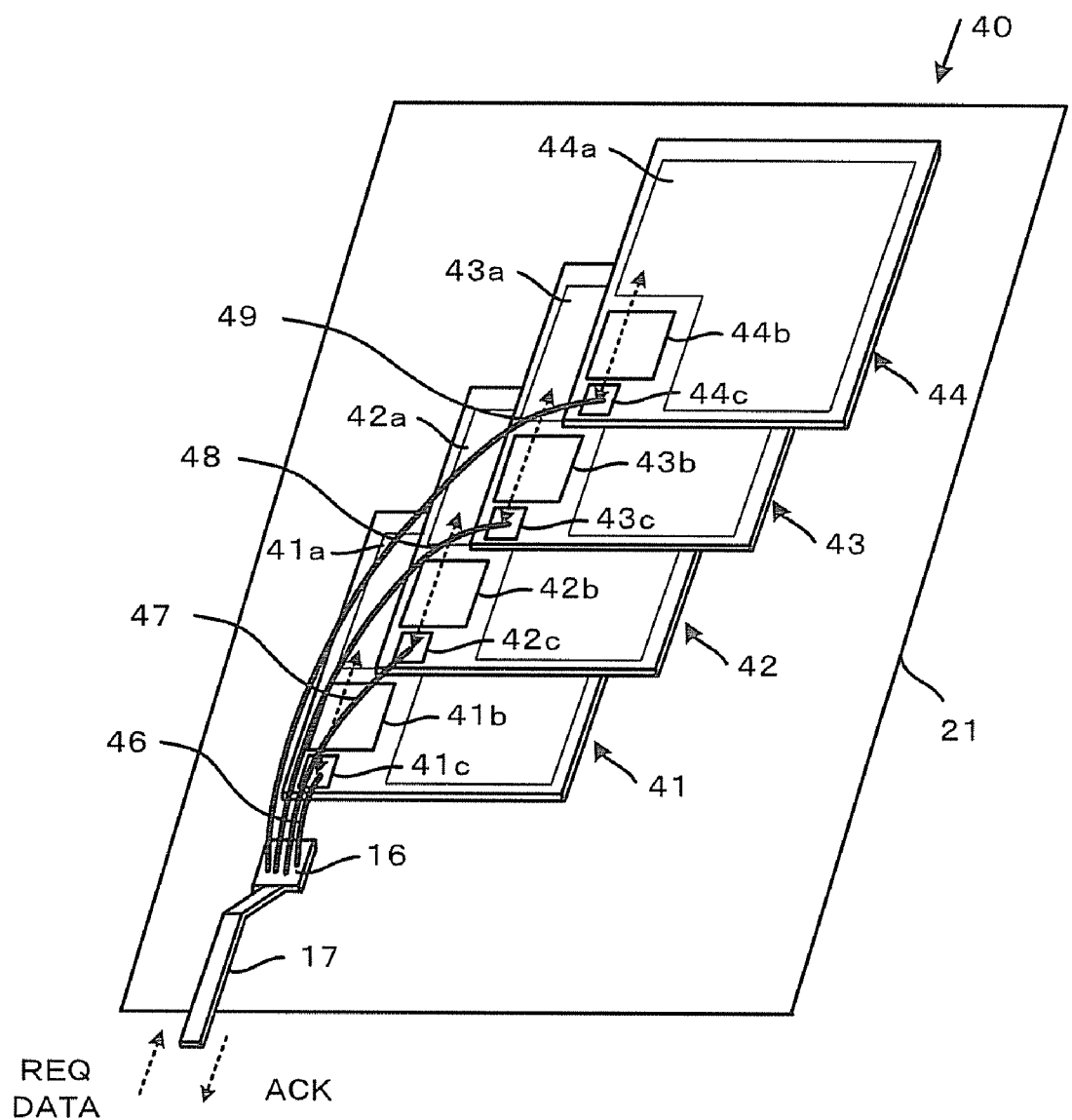
FIG. 9 is a perspective view showing a comparative example of the semiconductor integrated device according to the first embodiment.

FIG. 9 is a perspective view illustrating a semiconductor device of a comparative example. The comparative example is a semiconductor integrated device including stacked semiconductor chips sharing a pad and a signal wiring. As shown in FIG. 9, a semiconductor integrated device 40 in accordance with the comparative example includes semiconductor chips 41, 42, 43, 44 stacked while displaced from each other.

The semiconductor chip 41 includes a first internal circuit 41a and a second internal circuit 41b. The first internal circuit 41a processes a data signal in accordance with a predetermined process. When the second internal circuit 41b receives a request signal REQ from a host (not shown), the second internal circuit 41b determines whether the request signal REQ is the request to itself. When the request signal REQ is the request to itself, the second internal circuit 41b transmits an acknowledge signal ACK, indicating the reception of the request signal, to the host. After the host receives the acknowledge signal ACK, the second internal circuit 41b receives a data signal DATA from the host, and outputs the data signal DATA to the first internal circuit 41a.

The semiconductor chip 41 receives the request signal REQ and the data signal DATA from the host via a signal terminal 41c, and transmits the acknowledge signal ACK to the host. The signal terminal 41c is connected to the pad 16 via a signal wiring 46.

Since the semiconductor chips 42, 43, 44 are the same as the semiconductor chip 41, the descriptions thereof are omitted. Signal terminals 42c, 43c, 44c of the semiconductor chips 42, 43, 44 are commonly connected to the pad 16 via signal wirings 47, 48, 49, respectively.

Figure 10:
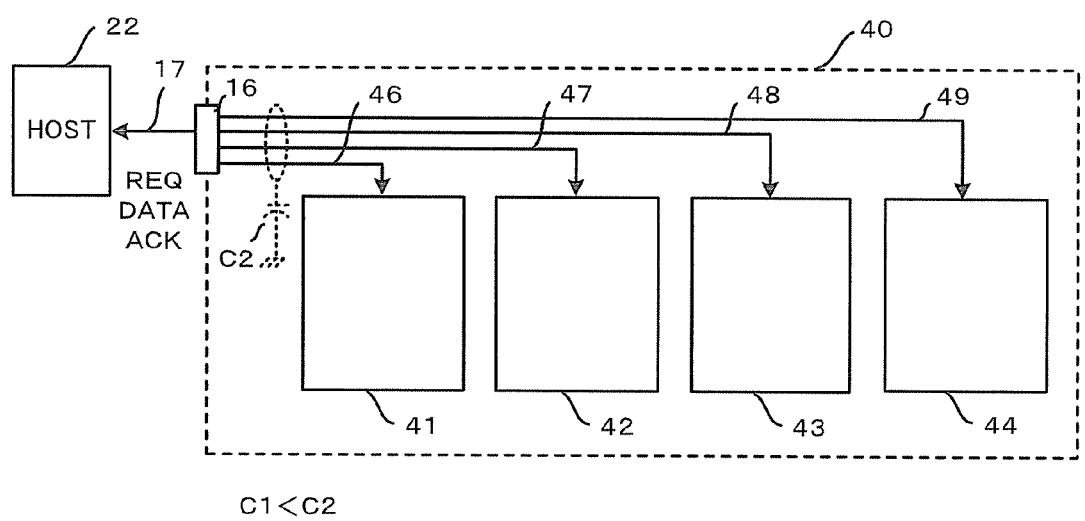
FIG. 10 is a view showing a signal transmission path of the comparative example of the semiconductor integrated device according to the first embodiment.

FIG. 10 is a diagram illustrating a signal transmission path of the semiconductor integrated device 40. As shown in FIG. 10, in the semiconductor integrated device 40, the semiconductor chips 41, 42, 43, 44 are connected in parallel to the host 22. The request signal REQ, the data signal DATA, and the acknowledge signal ACK are exchanged between the host 22 and each of the semiconductor chips 41, 42, 43, 44.

As a result, the load placed on each of the signal wirings 46, 47, 48, 49 is a capacity C2 which is a summation of capacities associated with all of the signal terminals 41c, 42c, 43c, 44c of the semiconductor chips 41, 42, 43, 44. The capacity C2 is larger than the capacity C1, and the load increases in accordance with the number of stacked semiconductor chips. Therefore, the transmission speed of the signal decreases, and a sufficient transmission speed cannot be obtained.

In contrast, as illustrated in FIG. 2, in the semiconductor integrated device 10 of the first embodiment, the load placed on each signal wiring is no more than the capacity C1, and the transmission speed of the signal does not decrease in accordance with the number of stacked semiconductor chips. Therefore, a sufficient signal transmission speed can be obtained.

As explained above, the semiconductor integrated device 10 of the first embodiment includes the first internal circuit and the second internal circuit, and also includes the multiple semiconductor chips 11, 12, 13, 14 stacked while displaced from each other. The transmission source with respect to a certain semiconductor chip is a semiconductor chip stacked on one side, and the transfer destination is a semiconductor chip stacked on the other side.

As a result, the request signal REQ, the data signal DATA, and the acknowledge signal ACK are exchanged only between the adjacent semiconductor chips. Accordingly, the load placed on each of the signal wirings is no more than the capacity C1 which is a summation of capacities associated with the first signal terminal and the second signal terminal of the adjacent semiconductor chips. Therefore, the semiconductor integrated device including the multiple stacked semiconductor chips and having a sufficient signal transmission speed can be obtained.

In the first embodiment, the four semiconductor chips are stacked, for example. However, the number of stacked semiconductor chips is not particularly limited.

In the first embodiment, the semiconductor chips 11, 12, 13, 14 are of the same type, for example. Alternatively, different types of semiconductor devices may be stacked.

[Second Embodiment]

Figure 11:
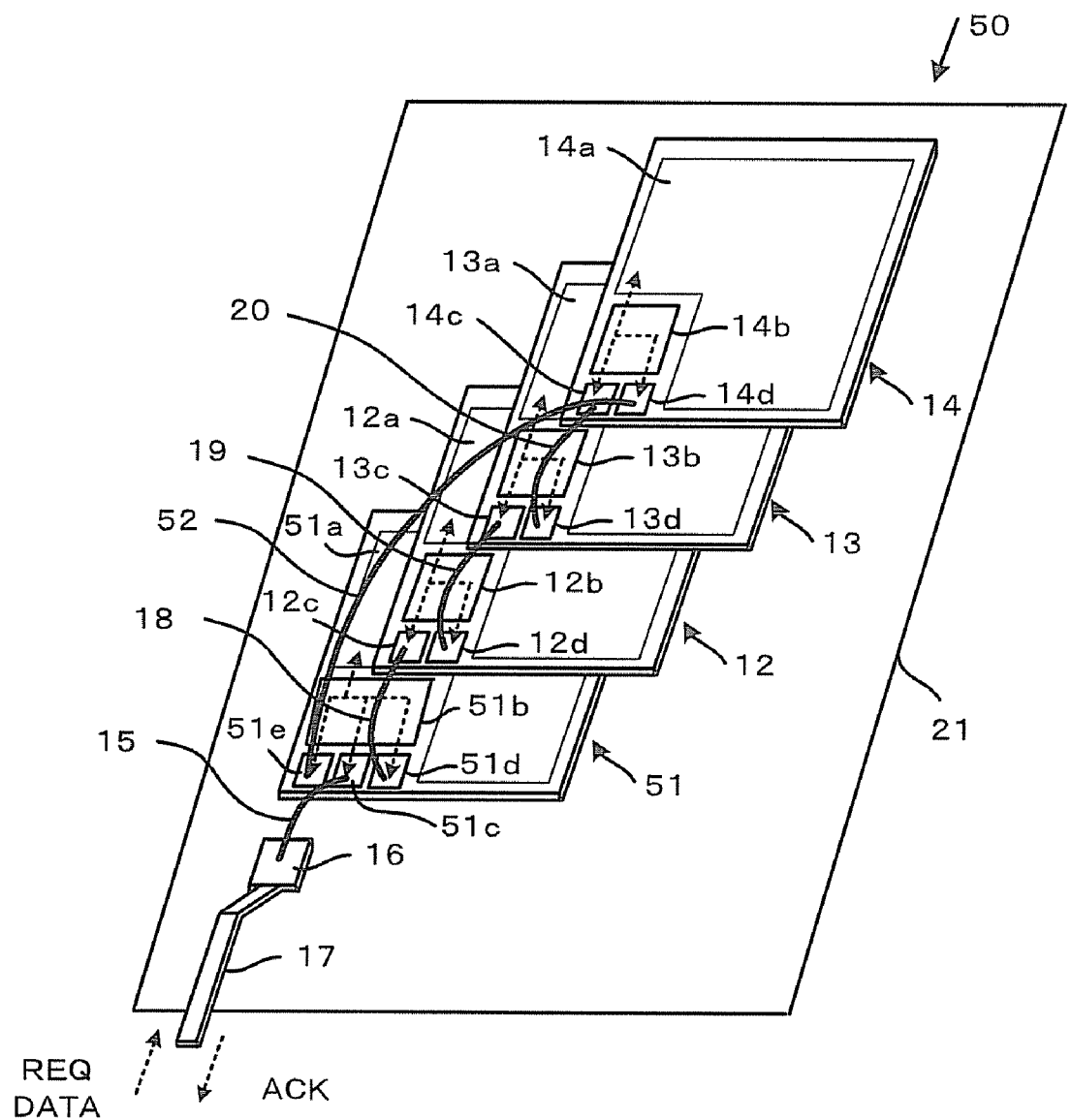
FIG. 11 is a perspective view showing a semiconductor integrated device according to a second embodiment.
Figure 12:
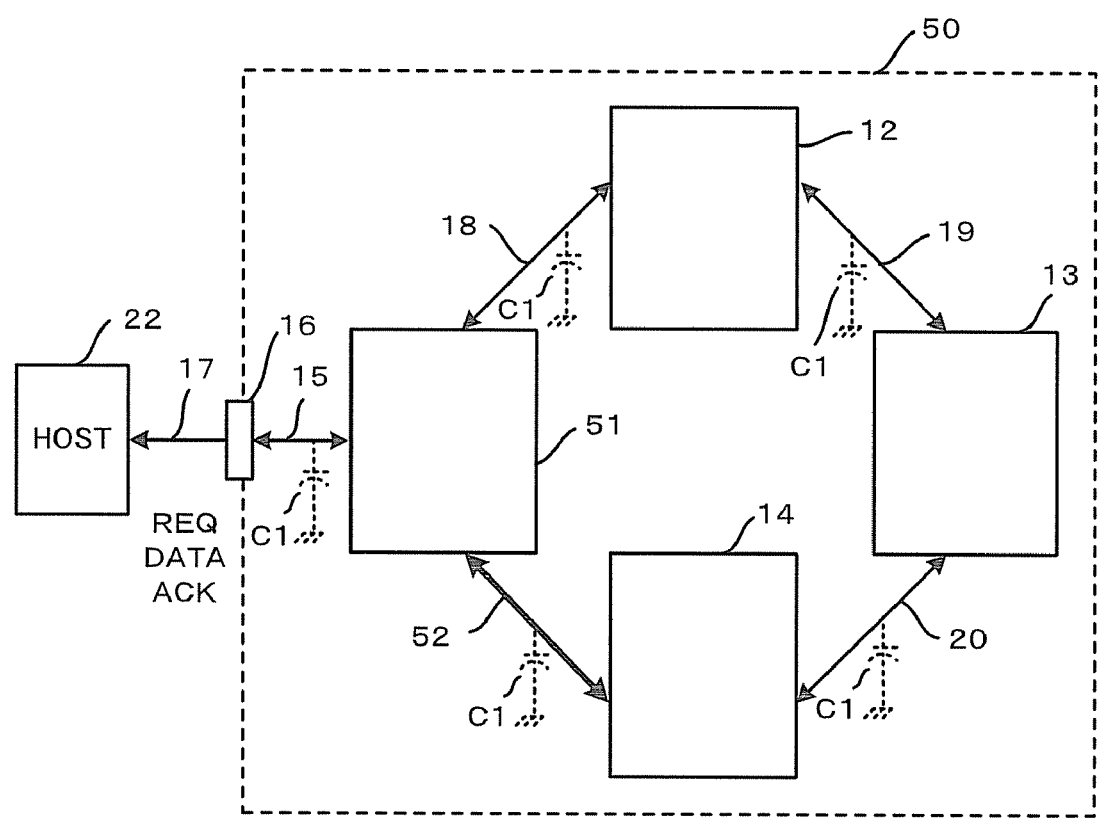
FIG. 12 is a view showing a signal transmission path of the semiconductor integrated device according to the second embodiment.
Figure 13:
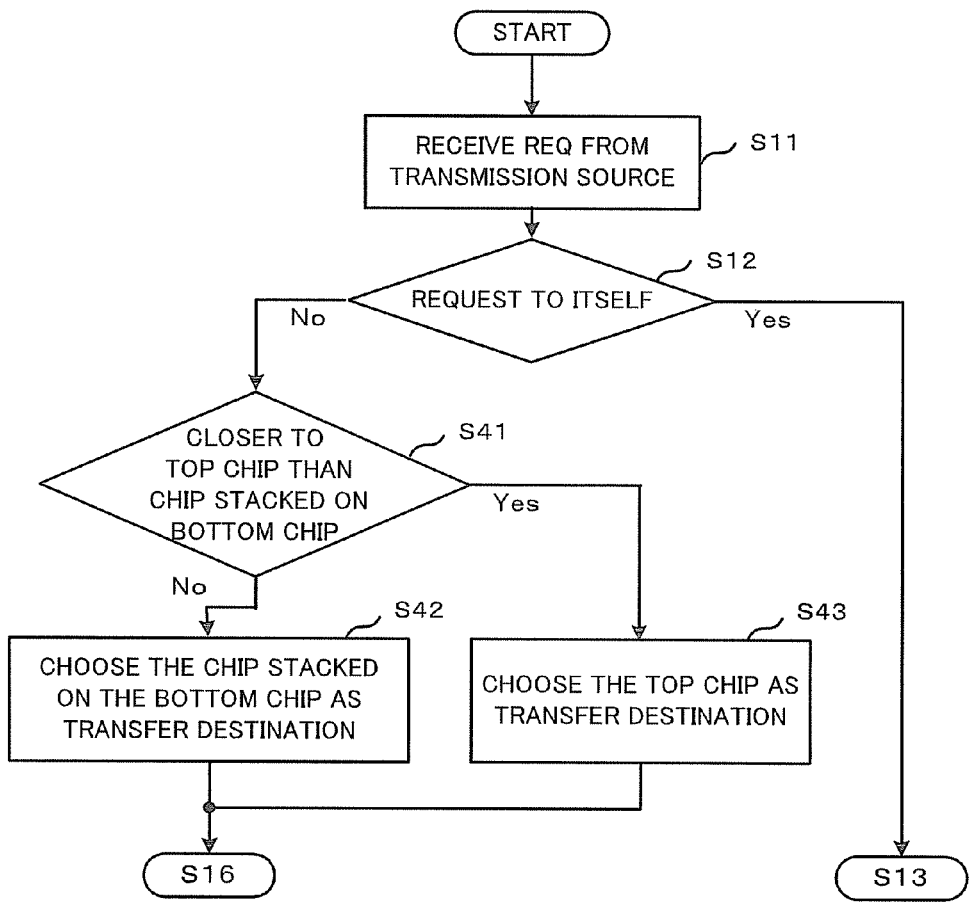
FIG. 13 is a flowchart showing a function of the main portion of the semiconductor integrated device according to the second embodiment.
Figure 14:
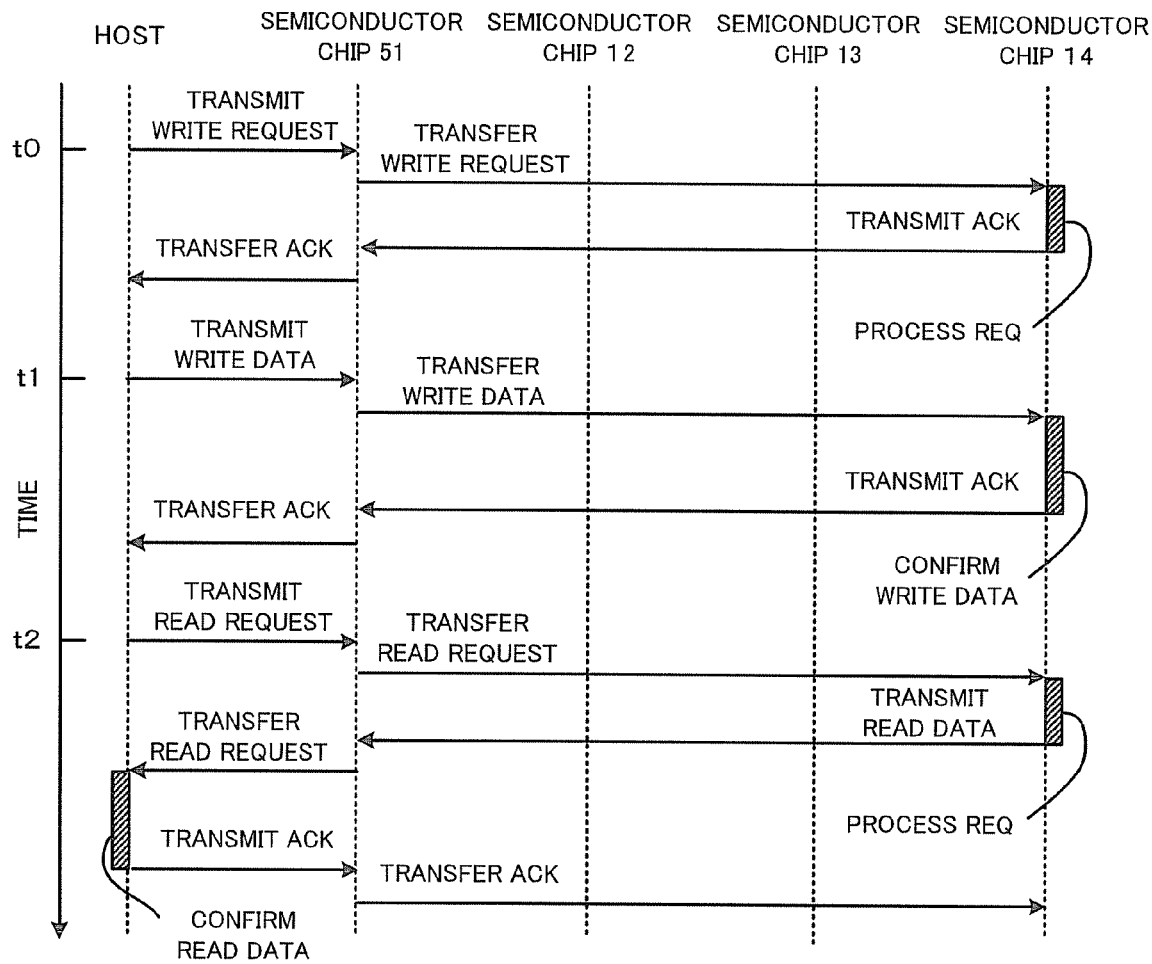
FIG. 14 is a timing chart showing an operation of the semiconductor integrated device according to the second embodiment.

A second embodiment of a semiconductor integrated device will be described with reference to FIGS. 11 to 14. FIG. 11 is a perspective view showing a semiconductor integrated device. FIG. 12 is a view showing a signal transmission path of the semiconductor integrated device. FIG. 13 is a flowchart showing a function of the main portion of the semiconductor integrated device. FIG. 14 is a timing chart showing an operation of the semiconductor integrated device.

In the embodiment, same reference numerals are given to denote component portions same as those of the first embodiment, and the descriptions thereof are omitted. Only different portions are described in the embodiment. The embodiment is different from the first embodiment in that a bottom semiconductor chip has two transfer destinations.

As shown in FIG. 11, in a semiconductor integrated device 50 of the second embodiment, a semiconductor chip 51 has a third signal terminal 51e having the same purpose as first and second signal terminals 51c, 51d. The third signal terminal 51e is connected to the second signal terminal 14d of the top semiconductor chip 14 via a signal wiring 52.

As shown in FIG. 12, in the semiconductor integrated device 50, the semiconductor chips 51, 12, 13, 14 are connected in a ring form via the signal wirings 18, 19, 20, 52. The request signal REQ, the data signal DATA, and the acknowledge signal ACK are bi-directionally exchanged only between the adjacent semiconductor chips. Accordingly, the load placed on the signal wiring 52 is no more than the capacity C1 which is a summation of capacities associated with the third signal terminal 51*e* of the semiconductor chip 51 and the second signal terminal 14*d* of the semiconductor chip 14.

As a result, regardless of the number of stacked semiconductor chips, a constant load is placed on each signal wiring. In addition, the transmission speed of the signal does not decrease, and a sufficient signal transmission speed can be obtained. Further, the signal transmission path between the bottom semiconductor chip 51 and the top semiconductor chip 14 can be shortened.

As shown in FIG. 13, in the semiconductor integrated device 50, when the bottom semiconductor chip 51 determines that the request signal REQ is not the request to itself (No in step S12), the bottom semiconductor chip 51 determines whether the requested semiconductor chip is closer to the semiconductor chip 12 (fourth semiconductor chip) stacked on the bottom semiconductor chip 51 or closer to the top semiconductor chip 14 (step S41). When the requested semiconductor chip is determined to be closer to the semiconductor chip 12 stacked on the bottom semiconductor chip 51 (No in step S41), the semiconductor chip 12 stacked on the bottom semiconductor chip 51 is chosen as the transfer destination (step S42). When the requested semiconductor chip is determined to be closer to the top semiconductor chip 14 (Yes in step S41), the top semiconductor chip 14 is chosen as the transfer destination (step S43).

FIG. 14 is a timing chart illustrating the operation of the semiconductor integrated device 50 in a case where a request is given to the top semiconductor chip 14. As shown in FIG. 14, when the host issues a write request to the semiconductor chip 51 at the time t0, the semiconductor chip 51 determines that the write request is not given to the semiconductor chip 51 itself but is given to the top semiconductor chip 14, and transfers the write request to the semiconductor chip 14.

When the semiconductor chip 14 receives the write request, the semiconductor chip 14 determines that the write request is given to the semiconductor chip 14 itself, and transmits an acknowledge signal, indicating that the request has been processed, to the semiconductor chip 51. When the semiconductor chip 51 receives the acknowledge signal, the semiconductor chip 51 transfers the acknowledge signal to the host.

When the host transmits write data to the semiconductor chip 51 at the time t1, the semiconductor chip 51 transfers the write data to the semiconductor chip 14. When the semiconductor chip 14 receives the write data, the semiconductor chip 14 writes the write data to the memory cell, and transmits an acknowledge signal, indicating the completion of the writing operation, to the semiconductor chip 51. When the semiconductor chip 51 receives the acknowledge signal, the semiconductor chip 51 transfers the acknowledge signal to the host.

When the host issues a read request to the semiconductor chip 51 at the time t2, the semiconductor chip 51 transfers the read request to the semiconductor chip 14. When the semiconductor chip 14 receives the read request, the semiconductor chip 14 reads data from the memory cell, and transmits the read data to the semiconductor chip 51. When the semiconductor chip 51 receives the read data, the semiconductor chip 51 transfers the read data to the host.

When the host receives the read data, the host confirms the read data, and transmits an acknowledge signal, indicating that the read data has been confirmed, to the semiconductor chip 51. When the semiconductor chip 51 receives the acknowledge signal, the semiconductor chip 51 transfers the acknowledge signal to the semiconductor chip 14.

Accordingly, when the request is given to the semiconductor chip 14, the semiconductor chip 51 can directly transfer the request signal REQ, the data signal DATA, and the acknowledge signal ACK to the semiconductor chip 14. Therefore, the trouble of successive transfer via the semiconductor chip 12 and the semiconductor chip 13 (fifth semiconductor chip) can be eliminated, and the transfer can be performed in a shorter time.

The number of stacked semiconductor chips is four. Accordingly, when the request is given to the semiconductor chip 13, the request signal REQ, the data signal DATA, and the acknowledge signal ACK may be transferred either by the semiconductor chips 51, 12 or by the semiconductor chips 51, 14. In either way, the transfer can be performed in a shorter time.

Alternatively, in a case where the number of stacked semiconductor chips is five or more, a shorter transfer route is chosen in accordance with the requested semiconductor chip. In a case where the number of stacked semiconductor chips is five, for example, the top semiconductor chip (not shown) is stacked on the semiconductor chip 14. When the request is given to the semiconductor chip 13, the request signal REQ, the data signal DATA, and the acknowledge signal ACK are transferred by the semiconductor chips 51, 12. When the request is given to the semiconductor chip 14 (sixth semiconductor chip), the request signal REQ, the data signal DATA, and the acknowledge signal ACK are transferred by the semiconductor chip 51 and the top semiconductor chip (not shown).

As explained above, in the semiconductor integrated device 50 of the second embodiment, when the request signal REQ is not given to the bottom semiconductor chip 51, the bottom semiconductor chip 51 determines whether the requested semiconductor chip is closer to the semiconductor chip 12 stacked on the bottom semiconductor chip 51 or closer to the top semiconductor chip 14. When the requested semiconductor chip is determined to be closer to the semiconductor chip 12 stacked on the bottom semiconductor chip 51, the semiconductor chip 12 stacked on the bottom semiconductor chip 51 is chosen as the transfer destination. When the requested semiconductor chip is determined to be closer to the top semiconductor chip 14, the top semiconductor chip 14 is chosen as the transfer destination.

Therefore, in a case where the request is given to the semiconductor chip closer to the top semiconductor chip 14, the transfer path of the request signal REQ, the data signal DATA, and the acknowledge signal ACK can be shortened. Accordingly, there is an advantage in that the transfer can be performed in a shorter time.

In the above explanation, only the bottom semiconductor chip 51 has the third signal terminal 51*e*. Alternatively, the other semiconductor chips may have the third signal terminal. Although the third signal terminals are not used, there is an advantage in that the trouble of identifying and managing semiconductor chips can be eliminated in the assembly step when the same type of semiconductor chip is used.

[Third Embodiment]

Figure 15:
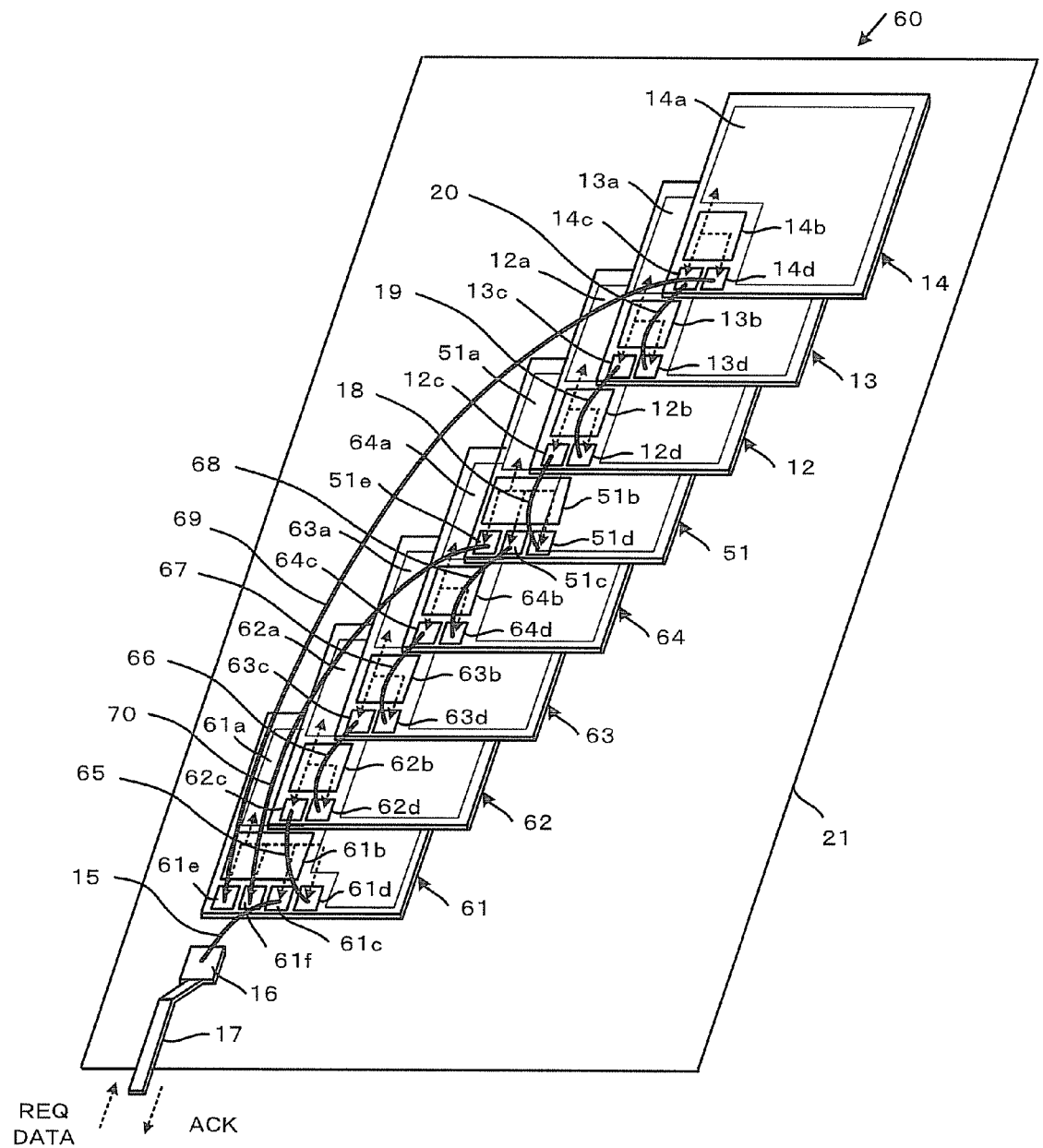
FIG. 15 is a perspective view showing a semiconductor integrated device according to a third embodiment.
Figure 16:
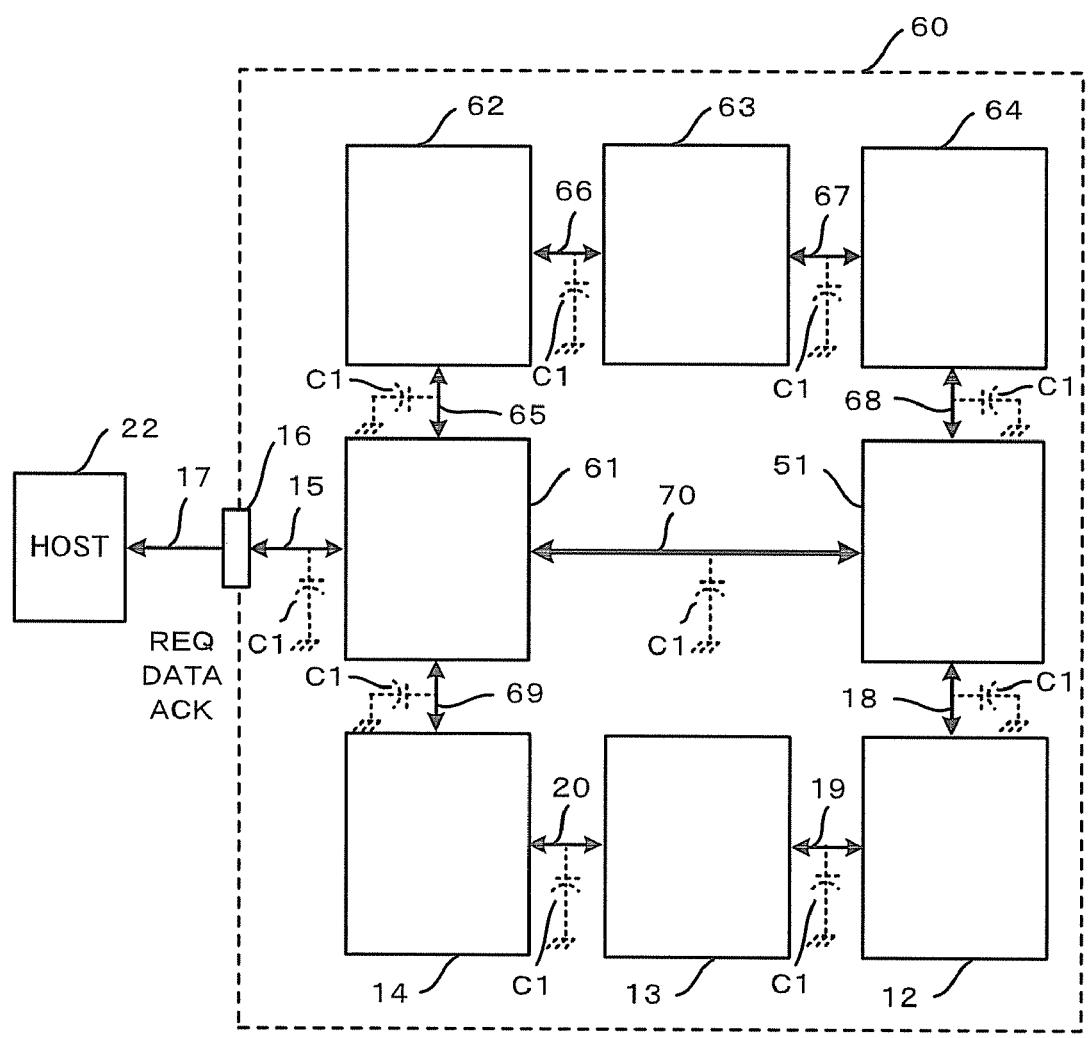
FIG. 16 is a view showing a signal transmission path of the semiconductor integrated device according to the third embodiment.
Figure 17:
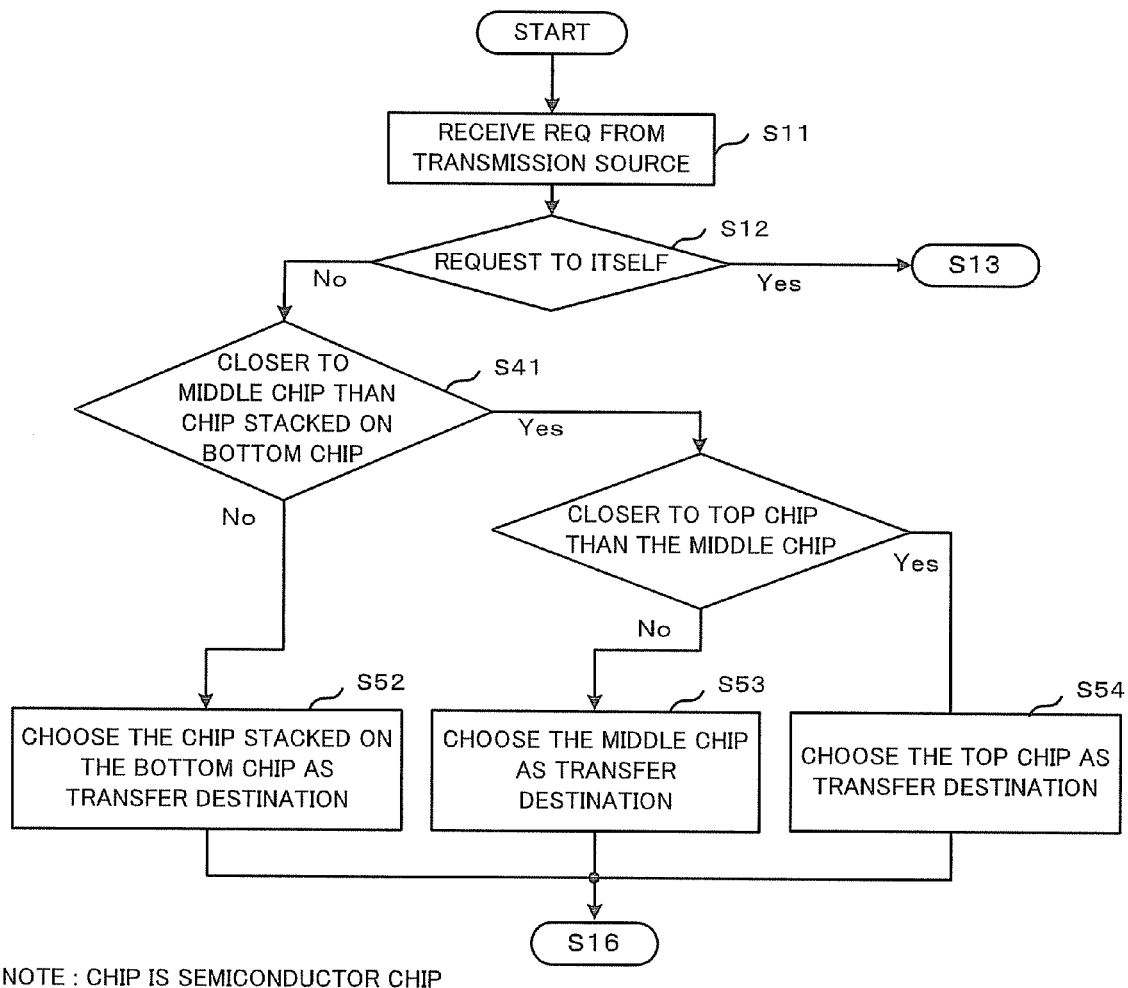
FIG. 17 is a flowchart showing a function of the main portion of the semiconductor integrated device according to the third embodiment.
Figure 18:
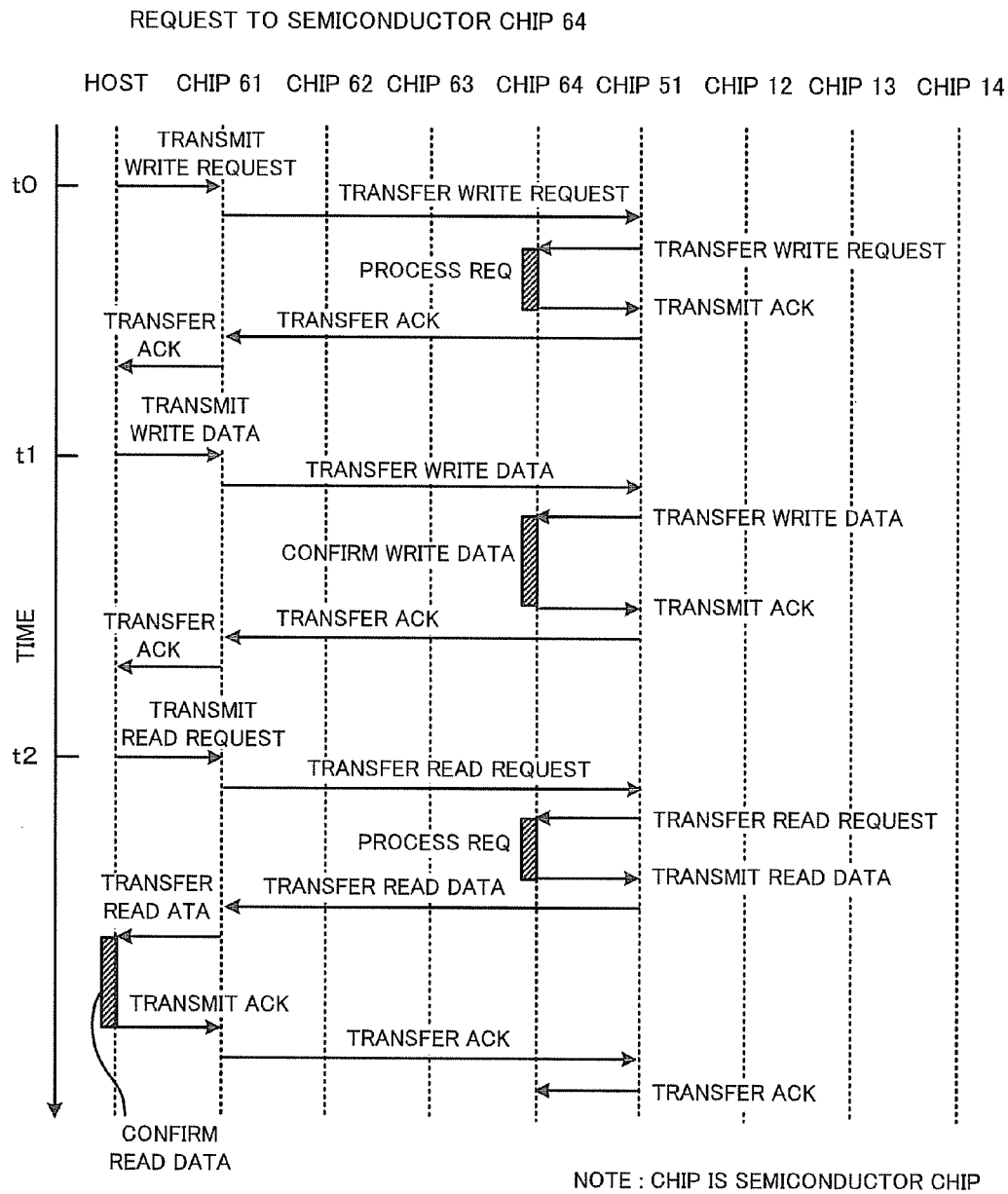
FIG. 18 is a timing chart showing an operation of the semiconductor integrated device according to the third embodiment.

A third embodiment of a semiconductor integrated device will be described with reference to FIGS. 15 to 18. FIG. 15 is a perspective view showing a semiconductor integrated device. FIG. 16 is a view showing a signal transmission path of the semiconductor integrated device. FIG. 17 is a flowchart showing a function of the main portion of the semiconductor integrated device. FIG. 18 is a timing chart showing an operation of the semiconductor integrated device.

In the embodiment, same reference numerals are given to denote component portions same as those of the second embodiment, and the descriptions thereof are omitted. Only different portions are described in the embodiment. The embodiment is different from the second embodiment in that a bottom semiconductor chip has three transfer destinations.

As shown in FIG. 15, in a semiconductor integrated device 60 of the third embodiment, a semiconductor chip 61 has a fourth signal terminal 61f having the same purpose as first to third signal terminals 61c, 61d, 61e. The first signal terminal 61c is connected to the pad 16 via the signal wiring 15. The second signal terminal 61d is connected to a first signal terminal 62c of a semiconductor chip 62 via a signal wiring 65.

The third signal terminal 61e is connected to the second signal terminal 14d of the top semiconductor chip 14 via a signal wiring 69. The fourth signal terminal 61f is connected to the third signal terminal 51e of the middle semiconductor chip 51 via a signal wiring 70.

The second signal terminal 62d of the semiconductor chip 62 is connected to a first signal terminal 63c of a semiconductor chip 63 stacked on the semiconductor chip 62 via a signal wiring 66. A second signal terminal 63d of the semiconductor chip 63 is connected to a first signal terminal 64c of a semiconductor chip 64 stacked on the semiconductor chip 63 via a signal wiring 67. A second signal terminal 64d of the semiconductor chip 64 is connected to the first signal terminal 51c of the semiconductor chip 51 stacked on the semiconductor chip 64 via a signal wiring 68.

As shown in FIG. 16, in the semiconductor integrated device 60, the semiconductor chips 61, 62, 63, 64, 51, 12, 13, 14 are connected in a ring form via the signal wirings 65, 66, 67, 68, 18, 19, 20, 69. The bottom semiconductor chip 61 and the middle semiconductor chip 51 are connected in a bridge form via the signal wiring 70.

As a result, the request signal REQ, the data signal DATA, and the acknowledge signal ACK are bi-directionally exchanged only between the adjacent semiconductor chips. Accordingly, the load placed on the signal wiring 70 is no more than the capacity C1 which is a summation of capacities associated with the fourth signal terminal 61f of the adjacent semiconductor chip 61 and the third signal terminal 51e of the semiconductor chip 51.

As a result, regardless of the number of stacked semiconductor chips, the load placed on each signal wiring becomes constant. In addition, the transmission speed of the signal does not decrease, and a sufficient signal transmission speed can be obtained. Further, the signal transmission path between the bottom semiconductor chip 51 and the middle semiconductor chip 51 can be reduced.

As shown in FIG. 17, in the semiconductor integrated device 60, when the bottom semiconductor chip 61 determines that the request signal REQ is not the request to itself (No in step S12), the bottom semiconductor chip 61 determines whether the requested semiconductor chip is closer to the semiconductor chip 62 (fourth semiconductor chip) stacked on the bottom semiconductor chip 61, the top semiconductor chip 14, or the middle semiconductor chip 51 between the top semiconductor chip 14 and the semiconductor chip 62 stacked on the bottom semiconductor chip 61. When the requested semiconductor chip is determined to be closer to the semiconductor chip 62 stacked on the bottom semiconductor chip 61 (No in step S51), the semiconductor chip 62 is chosen as the transfer destination (step 52). When the requested semiconductor chip is determined to be closer to the middle semiconductor chip 51 (No in step S53), the semiconductor chip 51 is chosen as the transfer destination (step S54). When the requested semiconductor chip is determined to be closer to the top semiconductor chip 14 (Yes in step S53), the semiconductor chip 14 is chosen as the transfer destination (step S55).

FIG. 18 is a timing chart illustrating the operation of the semiconductor integrated device 60 in a case where a request is given to the semiconductor chip 64 stacked in the middle. As shown in FIG. 18, when the host issues a write request to the semiconductor chip 61 at the time t0, the semiconductor chip 61 determines that the write request is not given to the semiconductor chip 61 itself but is given to the semiconductor chip 64 stacked in the middle. Then, the semiconductor chip 61 determines that the semiconductor chip 64 is closer to the middle semiconductor chip 51, and transfers the write request to the semiconductor chip 51.

When the semiconductor chip 51 receives the write request, the semiconductor chip 51 determines that the write request is not given to the semiconductor chip 51 itself but is given to the semiconductor chip 64 (seventh semiconductor chip), and transfers the write request to the semiconductor chip 64.

When the semiconductor chip 64 receives the write request, the semiconductor chip 64 determines that the write request is given to the semiconductor chip 64 itself, and transmits an acknowledge signal, indicating that the request has been processed, to the semiconductor chip 51. When the semiconductor chip 51 receives the acknowledge signal, the semiconductor chip 51 transfers the acknowledge signal to the semiconductor chip 61. When the semiconductor chip 61 receives the acknowledge signal, the semiconductor chip 61 transfers the acknowledge signal to the host.

The host transmits write data to the semiconductor chip 61 at the time t1. When the semiconductor chip 61 receives the write data, the semiconductor chip 61 transfers the write data to the semiconductor chip 51. When the semiconductor chip 51 receives the write data, the semiconductor chip 51 transfers the write data to the semiconductor chip 64.

When the semiconductor chip 64 receives the write data, the semiconductor chip 64 writes the write data to the memory cell, and transmits an acknowledge signal, indicating the completion of the writing operation, to the semiconductor chip 51. When the semiconductor chip 51 receives the acknowledge signal, the semiconductor chip 51 transfers the acknowledge signal to the semiconductor chip 61. When the semiconductor chip 61 receives the acknowledge signal, the semiconductor chip 61 transfers the acknowledge signal to the host.

When the host issues a read request to the semiconductor chip 61 at the time t2, the semiconductor chip 61 transfers the read request to the semiconductor chip 51. When the semiconductor chip 51 receives the read request, the semiconductor chip 51 transfers the read request to the semiconductor chip 64.

When the semiconductor chip 64 receives the read request, the semiconductor chip 64 reads data from the memory cell, and transmits the read data to the semiconductor chip 51. When the semiconductor chip 51 receives the read data, the semiconductor chip 65 transfers the read data to the semiconductor chip 61. When the semiconductor chip 61 receives the read data, the semiconductor chip 61 transfers the read data to the host.

When the host receives the read data, the host confirms the read data, and transmits an acknowledge signal, indicating that the read data has been confirmed, to the semiconductor chip 61. When the semiconductor chip 61 receives the acknowledge signal, the semiconductor chip 61 transfers the acknowledge signal to the semiconductor chip 51. When the semiconductor chip 51 receives the acknowledge signal, the semiconductor chip 51 transfers the acknowledge signal to the semiconductor chip 64.

Accordingly, when the request is given to the semiconductor chip 64, the request signal REQ, the data signal DATA, and the acknowledge signal ACK are transferred to the semiconductor chip 51 closest to the semiconductor chip 64. Therefore, the time needed for the transfer can be further reduced compared with the case where the transfer is performed in the ring form as explained above.

When the request is given to the semiconductor chip 12, the semiconductor chip 61 transfers the request signal REQ, the data signal DATA, and the acknowledge signal ACK to the semiconductor chip 51. When the request is given to the semiconductor chip 63, on the other hand, the semiconductor chip 61 transfers the request signal REQ, the data signal DATA, and the acknowledge signal ACK to the semiconductor chip 62. When the request is given to the semiconductor chip 13, the semiconductor chip 61 transfers the request signal REQ, the data signal DATA, and the acknowledge signal ACK to the semiconductor chip 14. The semiconductor chip 14 transfers the request signal REQ, the data signal DATA, and the acknowledge signal ACK to the semiconductor chip 13 (sixth semiconductor chip).

As explained above, in the semiconductor integrated device 60 of the third embodiment, when the bottom semiconductor chip 61 determines that the request signal REQ is not the request to itself, the bottom semiconductor chip 61 determines whether the requested semiconductor chip is closer to the semiconductor chip 62 stacked on the bottom semiconductor chip 61, the top semiconductor chip 14, or the middle semiconductor chip 51 between the top semiconductor chip 14 and the semiconductor chip 62 stacked on the bottom semiconductor chip 61. When the requested semiconductor chip is determined to be closer to the semiconductor chip 62 stacked on the bottom semiconductor chip 61, the semiconductor chip 62 is chosen as the transfer destination. When the requested semiconductor chip is determined to be closer to the top semiconductor chip 14, the semiconductor chip 14 is chosen as the transfer destination. When the requested semiconductor chip is determined to be closer to the middle semiconductor chip 51, the middle semiconductor chip 51 is chosen as the transfer destination.

Accordingly, the request signal REQ, the data signal DATA, and the acknowledge signal ACK can be transferred to the transfer destination closest to the requested semiconductor chip. Therefore, compared with the case where the transfer is performed in the ring form, there are advantages in that the transfer path can be shortened and the transfer can be performed in a shorter time.

In the above explanation, the bottom semiconductor chip 61 and the middle semiconductor chip 51 between the semiconductor chip 62 stacked on the bottom semiconductor chip 61 and the top semiconductor chip 14 are connected in a bridge form. However, the semiconductor chips connected in a bridge form are not particularly limited. For example, the semiconductor chips may be stacked so as to shift to the bottom side or the top side with respect to the middle.

Alternatively, the bottom semiconductor chip 61 and a middle semiconductor chip between the semiconductor chip 62 and the semiconductor chip 51 may be connected in a bridge form, or the bottom semiconductor chip 61 and a middle semiconductor chip between the semiconductor chip 14 and the semiconductor chip 51 may be connected in a bridge form. Such configuration is suitable for a semiconductor integrated device having a large number of stacked semiconductor chips.

In the above-described embodiment, the acknowledge signal ACK is used between the transmission source and the transfer destination in order to exchange the request signal REQ and the data signal DATA. Alternatively, the request signal REQ and the data signal DATA can be exchanged without using the acknowledge signal ACK.

In the above explanation, the request signal REQ and the data signal DATA are received and transferred via the pair of signal terminals in a bi-directional manner. Alternatively, the request signal REQ and the data signal DATA can be received and transferred via separate signal terminals.

In such case, the number of signal terminals and signal wirings increases. However, the host has a sufficiently large buffer for receiving read data, and accordingly the host can successively transmit read requests. Therefore, there is an advantage in that the transfer efficiency can be improved by simultaneously transferring read data and read request.

For example, the host issues the first read request to the semiconductor chip 14 at the time t2 as shown in FIG. 8, and thereafter, the read data is transferred from the semiconductor chip 13 to the semiconductor chip 12. In such occasion, when the read request is transferred from the semiconductor chip 12 to the semiconductor chip 13, the host can issue the second read request to the semiconductor chip 14.

Likewise, the read data is transferred from the semiconductor chip 12 to the semiconductor chip 11. In such occasion, when the read request is transferred from the semiconductor chip 11 to the semiconductor chip 12, the host can issue the third read request to the semiconductor chip 14.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor integrated device, comprising:
a plurality of semiconductor chips each having a first internal circuit and a second internal circuit and being stacked while displaced from each other,
wherein the first internal circuit processes a data signal in accordance with a predetermined process,
wherein the second internal circuit receives a request signal from a transmission source and determines whether the request signal is a request to itself or not,
wherein, when the request signal is the request to the second internal circuit itself, the second internal circuit receives a data signal from a transmission source and outputs the data signal to the first internal circuit,
wherein, when the request signal is not the request to the second internal circuit itself, the second internal circuit transfers the request signal to a transfer destination, receives the data signal from the transmission source and transfers the data signal to the transfer destination,
wherein the transmission source with respect to a first semiconductor chip of the plurality of semiconductor chips is a second semiconductor chip of the plurality of semiconductor chips stacked on one side from the first semiconductor chip, and
wherein the transfer destination with respect to the first semiconductor chip is a third semiconductor chip of the plurality of semiconductor chips stacked on the other side from the first semiconductor chip.

2. The semiconductor integrated device according to claim 1, wherein the second internal circuit includes:

a synchronization circuit to receive a serial data signal corresponding to the request signal and the data signal and to synchronize the serial data signal with a timing of an internal clock signal;

a serial-parallel conversion circuit to convert the serial data signal synchronized with the timing of the internal clock signal into a parallel data signal;

a signal processing circuit to process the parallel data signal in accordance with a predetermined process; and a parallel-serial conversion circuit to convert the parallel data signal into the serial data signal and to output the serial data signal to outside.

3. The semiconductor integrated device according to claim 2, wherein, when the serial data signal is the request signal, the signal processing circuit decodes the parallel data signal and determines a requested semiconductor chip, and wherein, when the serial data signal is not the request signal, the signal processing circuit outputs the parallel data signal to the first internal circuit or the parallel-serial conversion circuit.

4. The semiconductor integrated device according to claim 1, wherein each semiconductor chip has at least two signal terminals so as to exchange the request signal and the data signal bi-directionally between the transmission source and the transfer destination.

5. The semiconductor integrated device according to claim 1, wherein the transmission source with respect to a bottom semiconductor chip of the plurality of semiconductor chips is an external circuit.

6. The semiconductor integrated device according to claim 1, wherein, when the request signal is the request to itself, the second internal circuit transmits a first acknowledge signal and a second acknowledge signal to the transmission source, wherein, when the request signal is not the request to itself, the second internal circuit transfers the first and the second acknowledge signals from the transfer destination to the transmission source, and wherein the first acknowledge signal indicates that the request signal has been processed, and the second acknowledge signal indicates that the data signal has been processed.

7. The semiconductor integrated device according to claim 1, wherein the plurality of the semiconductor chips are connected in series via a signal wiring.

8. The semiconductor integrated device according to claim 7, wherein the second semiconductor chip is stacked under the first semiconductor chip, and the third semiconductor chip is stacked on the first semiconductor chip.

9. The semiconductor integrated device according to claim 1, wherein the plurality of the semiconductor chips are connected in a ring form via a signal wiring.

10. The semiconductor integrated device according to claim 9, wherein, when the bottom semiconductor chip determines that the request signal is not to itself, the bottom semiconductor chip determines whether the requested semiconductor chip is closer to a fourth semiconductor chip stacked on the bottom semiconductor chip or closer to a top semiconductor chip of the plurality of semiconductor chips, wherein, when the requested semiconductor chip is determined to be closer to the fourth semiconductor chip, the fourth semiconductor chip is chosen as the transfer destination, and wherein, when the requested semiconductor chip is determined to be closer to the top semiconductor chip, the top semiconductor chip is chosen as the transfer destination.

11. The semiconductor integrated device according to claim 10, wherein, when the requested semiconductor chip is not the fourth semiconductor chip, a fifth semiconductor chip stacked on the fourth semiconductor chip is chosen as the transfer destination.

12. The semiconductor integrated device according to claim 10, wherein, when the requested semiconductor chip is not the top semiconductor chip, a sixth semiconductor chip stacked under the top semiconductor chip is chosen as the transfer destination.

13. The semiconductor integrated device according to claim 9, wherein the bottom semiconductor chip has three signal terminals so as to exchange the request signal and the data signal bi-directionally between the transmission source and the transfer destination.

14. The semiconductor integrated device according to claim 1, wherein the plurality of the semiconductor chips are connected in a ring form via a signal wiring, and the bottom semiconductor chip and a middle semiconductor chip of the plurality of the semiconductor chips are connected in a bridge form via a signal wiring.

15. The semiconductor integrated device according to claim 14, wherein, when the bottom semiconductor chip determines that the request signal is not the request to itself, the bottom semiconductor chip determines whether the requested semiconductor chip is closer to the fourth semiconductor chip stacked on the bottom semiconductor chip, the top semiconductor chip, or the middle semiconductor chip, wherein, when the requested semiconductor chip is determined to be closer to the fourth semiconductor chip, the fourth semiconductor chip is chosen as the transfer destination, wherein, when the requested semiconductor chip is determined to be closer to the top semiconductor chip, the top semiconductor chip is chosen as the transfer destination, and wherein, when the requested semiconductor chip is determined to be closer to the middle semiconductor chip, the middle semiconductor chip is chosen as the transfer destination.

16. The semiconductor integrated device according to claim 15, wherein, when the requested semiconductor chip is not the middle semiconductor chip, a seventh semiconductor chip stacked on the middle semiconductor chip faced to the requested semiconductor chip is chosen as the transfer destination.

17. The semiconductor integrated device according to claim 15, wherein, when the requested semiconductor chip is not the top semiconductor chip, the sixth semiconductor chip stacked under the top semiconductor chip is chosen as the transfer destination.

18. The semiconductor integrated device according to claim 15, wherein the bottom semiconductor chip has four signal terminals so as to exchange the request signal and the data signal bi-directionally between the transmission source and the transfer destination.

19. The semiconductor integrated device according to claim 15, wherein the middle semiconductor chip has three signal terminals so as to exchange the request signal and the data signal bi-directionally between the transmission source and the transfer destination.

20. The semiconductor integrated device according to claim 1, wherein the first internal circuit has a memory circuit to store the information of the data signal.

* * * * *